(12) United States Patent
Hallin et al.

(10) Patent No.: US 12,557,322 B2
(45) Date of Patent: Feb. 17, 2026

(54) GROUP III-NITRIDE TRANSISTORS WITH BACK BARRIER STRUCTURES AND BURIED P-TYPE LAYERS AND METHODS THEREOF

(71) Applicant: CREE, INC., Durhamn, NC (US)

(72) Inventors: Christer Hallin, Hillsborough, NC (US); Saptharishi Sriram, Cary, NC (US); Jia Guo, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 313 days.

(21) Appl. No.: 17/322,199

(22) Filed: May 17, 2021

(65) Prior Publication Data

US 2022/0367697 A1     Nov. 17, 2022

(51) Int. Cl.
*H01L 29/20* (2006.01)
*H01L 21/76* (2006.01)
(Continued)

(52) U.S. Cl.
CPC ....... *H10D 30/475* (2025.01); *H01L 21/7605* (2013.01); *H01L 21/765* (2013.01);
(Continued)

(58) Field of Classification Search
CPC ............... H01L 21/7605; H01L 21/765; H01L 29/2003; H01L 29/205; H01L 29/7786;
(Continued)

(56) References Cited

U.S. PATENT DOCUMENTS

| 5,289,015 A | 2/1994 | Chirovsky et al. |
|---|---|---|
| 5,318,915 A | 6/1994 | Baliga et al. |

(Continued)

FOREIGN PATENT DOCUMENTS

| CN | 1717811 A | 1/2006 |
|---|---|---|
| CN | 102623493 A | 8/2012 |

(Continued)

OTHER PUBLICATIONS

International Search Report and Written Opinion issued in PCT/US2020/015331, dated Mar. 4, 2020; 8 pages.

(Continued)

*Primary Examiner* — Marlon T Fletcher
*Assistant Examiner* — Christina A Sylvia
(74) *Attorney, Agent, or Firm* — BakerHostetler

(57) ABSTRACT

An apparatus configured to reduce lag includes a substrate; a group III-Nitride back barrier layer on the substrate; a group III-Nitride channel layer on the group III-Nitride back barrier layer; a group III-Nitride barrier layer on the group III-Nitride channel layer, the group III-Nitride barrier layer include a higher bandgap than a bandgap of the group III-Nitride channel layer; a source electrically coupled to the group III-Nitride barrier layer; a gate on the group III-Nitride barrier layer; a drain electrically coupled to the group III-Nitride barrier layer; and a p-region being arranged at or below the group III-Nitride barrier layer. Additionally, at least a portion of the p-region is arranged vertically below at least one of the following: the source, the gate, an area between the gate and the drain.

48 Claims, 12 Drawing Sheets

(51) Int. Cl.
*H01L 21/765* (2006.01)
*H10D 30/01* (2025.01)
*H10D 30/47* (2025.01)
*H10D 62/824* (2025.01)
*H10D 62/85* (2025.01)
*H10D 64/00* (2025.01)

(52) U.S. Cl.
CPC ......... *H10D 30/015* (2025.01); *H10D 62/824* (2025.01); *H10D 62/8503* (2025.01); *H10D 64/111* (2025.01)

(58) Field of Classification Search
CPC ............. H01L 29/402; H01L 29/66462; H01L 29/1075; H01L 29/7783; H01L 29/0843; H01L 29/41758
See application file for complete search history.

(56) References Cited

U.S. PATENT DOCUMENTS

| | | |
|---|---|---|
| 6,639,277 B2 | 10/2003 | Rumennik et al. |
| 6,956,239 B2 | 10/2005 | Sriram |
| 7,646,043 B2 | 1/2010 | Sriram et al. |
| 7,696,566 B2 | 4/2010 | Disney |
| 7,812,369 B2 | 10/2010 | Chini et al. |
| 8,698,162 B2 | 4/2014 | Lee et al. |
| 8,759,879 B1 | 6/2014 | Tipirneni et al. |
| 8,890,211 B1 | 11/2014 | Mayo et al. |
| 8,901,609 B1 | 12/2014 | Chen et al. |
| 9,337,332 B2 | 5/2016 | Chu et al. |
| 9,484,862 B2 | 11/2016 | De Rooij et al. |
| 9,621,153 B2 | 4/2017 | Ikeda et al. |
| 10,263,577 B2 | 4/2019 | Van Zyl |
| 10,290,730 B1 | 5/2019 | Yang et al. |
| 2002/0066960 A1 | 6/2002 | Ring |
| 2003/0141518 A1 | 7/2003 | Yokogawa et al. |
| 2004/0099888 A1 | 5/2004 | Sriram |
| 2004/0124435 A1 | 7/2004 | D'Evelyn et al. |
| 2004/0149993 A1 | 8/2004 | McClure et al. |
| 2004/0201037 A1 | 10/2004 | Fareed et al. |
| 2005/0121694 A1 | 6/2005 | Mun et al. |
| 2005/0224809 A1 | 10/2005 | Sriram |
| 2006/0125001 A1 | 6/2006 | Sriram |
| 2007/0051977 A1 | 3/2007 | Saito et al. |
| 2007/0059873 A1 | 3/2007 | Chini et al. |
| 2007/0246713 A1 | 10/2007 | Arnold et al. |
| 2007/0292999 A1 | 12/2007 | Henning et al. |
| 2008/0315257 A1 | 12/2008 | Shiraishi |
| 2009/0120924 A1 | 5/2009 | Moffatt et al. |
| 2010/0084742 A1 | 4/2010 | Sazawa et al. |
| 2011/0215338 A1 | 9/2011 | Zhang |
| 2011/0260174 A1 | 10/2011 | Hebert |
| 2012/0025206 A1* | 2/2012 | Nakata .............. H01L 21/02378 257/77 |
| 2012/0068227 A1 | 3/2012 | Hikita et al. |
| 2012/0153300 A1 | 6/2012 | Lidow et al. |
| 2012/0187451 A1 | 7/2012 | Saito |
| 2012/0217511 A1 | 8/2012 | Renaud et al. |
| 2012/0286355 A1 | 11/2012 | Mauder et al. |
| 2012/0319127 A1 | 12/2012 | Chowdhury et al. |
| 2013/0049014 A1 | 2/2013 | Aigo et al. |
| 2013/0062671 A1 | 3/2013 | Saito et al. |
| 2013/0153967 A1 | 6/2013 | Curatola |
| 2013/0221320 A1 | 8/2013 | Li et al. |
| 2014/0070278 A1* | 3/2014 | Briere .................. H10D 64/518 257/194 |
| 2014/0117381 A1 | 5/2014 | Kang et al. |
| 2014/0145203 A1 | 5/2014 | Escoffier et al. |
| 2014/0253241 A1 | 9/2014 | Lee et al. |
| 2014/0264379 A1 | 9/2014 | Kub et al. |
| 2014/0264960 A1 | 9/2014 | Ring et al. |
| 2015/0028345 A1 | 1/2015 | Wong et al. |
| 2015/0028350 A1 | 1/2015 | Suvorov et al. |
| 2015/0115325 A1 | 4/2015 | Vielemeyer |
| 2015/0145032 A1 | 5/2015 | Quay et al. |
| 2015/0236146 A1 | 8/2015 | Liu et al. |
| 2015/0318387 A1 | 11/2015 | Chiu et al. |
| 2015/0349117 A1 | 12/2015 | Chu et al. |
| 2015/0372124 A1 | 12/2015 | Isobe et al. |
| 2016/0035870 A1 | 2/2016 | Wu et al. |
| 2016/0071967 A1 | 3/2016 | Prechtl et al. |
| 2016/0086878 A1 | 3/2016 | Otremba et al. |
| 2016/0254377 A1 | 9/2016 | Morancho et al. |
| 2016/0293709 A1 | 10/2016 | Nakayama et al. |
| 2016/0351567 A1 | 12/2016 | Schmid |
| 2017/0018638 A1 | 1/2017 | Teo et al. |
| 2017/0033210 A1 | 2/2017 | Curatola et al. |
| 2017/0069713 A1 | 3/2017 | Roberts et al. |
| 2017/0194471 A1 | 7/2017 | Pei |
| 2017/0244407 A1 | 8/2017 | Prechtl et al. |
| 2017/0250273 A1* | 8/2017 | Schultz .............. H01L 29/7783 |
| 2017/0365702 A1 | 12/2017 | Prechtl et al. |
| 2017/0373176 A1 | 12/2017 | Sriram |
| 2017/0373178 A1 | 12/2017 | Sriram et al. |
| 2018/0083105 A1 | 3/2018 | Nagy et al. |
| 2018/0167043 A1 | 6/2018 | Van Zyl |
| 2018/0204940 A1* | 7/2018 | Schultz .............. H01L 29/7783 |
| 2018/0204941 A1 | 7/2018 | Odnoblyudov et al. |
| 2018/0269282 A1 | 9/2018 | Yang et al. |
| 2019/0229187 A1* | 7/2019 | Sriram .................. H01L 29/205 |
| 2019/0237569 A1* | 8/2019 | Sriram ............... H01L 29/7787 |
| 2019/0356274 A1 | 11/2019 | Zhu et al. |
| 2020/0219987 A1 | 7/2020 | Lee et al. |
| 2020/0357907 A1 | 11/2020 | Urdrea et al. |
| 2021/0126120 A1* | 4/2021 | Piedra ................. H01L 29/7786 |
| 2021/0167199 A1 | 6/2021 | Sriram et al. |

FOREIGN PATENT DOCUMENTS

| | | |
|---|---|---|
| CN | 103178108 A | 6/2013 |
| CN | 103329256 A | 9/2013 |
| CN | 105405877 A | 3/2016 |
| CN | 109564940 A | 4/2019 |
| CN | 212062440 U | 12/2020 |
| EP | 3276670 A1 | 1/2018 |
| JP | 2002-076024 A | 3/2002 |
| JP | 2006-507683 A | 3/2006 |
| JP | 2007-103451 A | 4/2007 |
| JP | 2008-112868 A | 5/2008 |
| JP | 2011-151176 A | 8/2011 |
| JP | 2012-156320 A | 8/2012 |
| JP | 2012-231002 A | 11/2012 |
| JP | 2012-238751 A | 12/2012 |
| JP | 2012-248632 A | 12/2012 |
| JP | 2012-248753 A | 12/2012 |
| JP | 2013-038250 A | 2/2013 |
| JP | 2013-106022 A | 5/2013 |
| JP | 2013-131755 A | 7/2013 |
| JP | 2013-229449 A | 11/2013 |
| JP | 2014-504013 A | 2/2014 |
| JP | 2014-520405 A | 8/2014 |
| JP | 2016-051817 A | 4/2016 |
| JP | 2016-537828 A | 12/2016 |
| JP | 2017-059786 A | 3/2017 |
| JP | 2017-528912 A | 9/2017 |
| JP | 2018-528614 A | 9/2018 |
| JP | 2019-091757 A | 6/2019 |
| JP | 2019-519121 A | 7/2019 |
| KR | 2015-0120358 A | 10/2015 |
| KR | 2019-0104060 A | 9/2019 |
| WO | WO 2014/125094 A1 | 8/2014 |
| WO | WO 2015/013620 A1 | 1/2015 |
| WO | WO 2017/223403 A1 | 12/2017 |
| WO | WO 2020/159934 A1 | 8/2020 |

OTHER PUBLICATIONS

International Patent Application No. PCT/US2022/028963; Int'l Search Report and the Written Opinion; dated Sep. 1, 2022; 12 pages.
European Patent Application No. 20749178.8; Partial Search Report; dated Sep. 28, 2022; 10 pages.

(56) References Cited

OTHER PUBLICATIONS

Chiu et al.; "Analysis of the Back-Gate Effect in Normally Off p-GaN Gate High-Electron Mobility Transistor"; IEEE Transactions on Electron Devices; vol. 62 No. 2; Feb. 2015; p. 507-511.
International Patent Application No. PCT/US2022/18489; Int'l Search Report and the Written Opinion; dated May 23, 2022; 22 pages.
R R. Pela, C. Caetano, M. Marques, L. G. Ferreira, J. Furthmuller, and L. K. Teles, "Accurate band gaps of AlGaN, InGaN, and AlInN alloys calculations based on LDA-1/2 approach", Appl. Phys. Lett. 98, 151907 (2011) Appl. Phys. Lett. 98, 151907; 3 pages. (Year: 2011).
Shailaja P. Rao, "Implant Annealing of al dopants in silicon carbide using silane overpressure", Scholar Commons, University of South Florida, 2005, pp. 21-22; Retrieved from http://scholarscommons.usf.edu/cgi/viewcontent.cgiarticle=1828 context=e-td on Aug. 28, 2017 [Cited in related U.S. Appl. No. 15/192,545 and U.S. Appl. No. 15/192,545].
International Patent Application No. PCT/US2022/13085; Int'l Search Report and the Written Opinion; dated Jun. 28, 2022; 21 pages.
European Patent Application No. 20749178.8; Extended Search Report; dated Feb. 2, 2023; 11 pages.
European Patent Application No. 22753113.4; Extended Search Report; dated Dec. 3, 2024; 9 pages.
European Patent Application No. 22805124.9; Extended Search Report; dated Feb. 21, 2025; 10 pages.
European Patent Application No. 22805206.4; Extended Search Report; dated Feb. 21, 2025; 10 pages.

\* cited by examiner

GROUP III-NITRIDE TRANSISTORS WITH BACK BARRIER STRUCTURES AND BURIED P-TYPE LAYERS AND METHODS THEREOF

FIELD OF THE DISCLOSURE

The disclosure relates to Group III-Nitride transistors with back barrier structures and buried p-type layers and methods thereof. The disclosure also relates to Group III-Nitride transistors with back barrier structures and buried p-type layers. The disclosure further relates to methods associated with Group III-Nitride transistors with back barrier structures and buried p-type layers. The disclosure further relates to methods of making Group III-Nitride transistors with back barrier structures and buried p-type layers. The disclosure further relates to methods of implementing Group III-Nitride transistors with back barrier structures and buried p-type layers.

BACKGROUND OF THE DISCLOSURE

Group III-Nitride based or gallium nitride (GaN) based high-electron mobility transistors (HEMTs) are very promising candidates for high power radiofrequency (RF) applications, both in discrete and MMIC (Monolithic Microwave Integrated Circuit) forms. Current GaN HEMT designs use buffer layers that include traps to achieve desired breakdown. However, these traps cause memory effects that adversely affect performance. In particular, these designs show some trapping associated with what is called a "lag effect."

Accordingly, there is a need for a solution to addressing a lag effect and/or other negative performance issues in Group-III nitride HEMTs and improving the performance of such devices.

SUMMARY OF THE DISCLOSURE

One general aspect includes an apparatus that includes a substrate; a group III-Nitride back barrier layer on the substrate; a group III-Nitride channel layer on the group III-Nitride back barrier layer; a group III-Nitride barrier layer on the group III-Nitride channel layer, the group III-Nitride barrier layer include a higher bandgap than a bandgap of the group III-Nitride channel layer; a source electrically coupled to the group III-Nitride barrier layer; a gate on the group III-Nitride barrier layer; a drain electrically coupled to the group III-Nitride barrier layer; and a p-region being arranged at or below the group III-Nitride barrier layer, where at least a portion of the p-region is arranged vertically below at least one of the following: the source, the gate, an area between the gate and the drain.

One general aspect includes a method of making a device that includes providing a substrate; providing a group III-Nitride back barrier layer on the substrate; providing a group III-Nitride channel layer on the group III-Nitride back barrier layer; providing a group III-Nitride barrier layer on the group III-Nitride channel layer, the group III-Nitride barrier layer include a higher bandgap than a bandgap of the group III-Nitride channel layer; electrically coupling a source to the group III-Nitride barrier layer; arranging a gate on the group III-Nitride barrier layer; electrically coupling a drain to the group III-Nitride barrier layer; and providing a p-region being arranged at or below the group III-Nitride barrier layer, where at least a portion of the p-region is arranged vertically below at least one of the following: the source, the gate, an area between the gate and the drain.

One general aspect includes a Group III-Nitride transistor with at least one back barrier structure and at least one buried p-type layer.

One general aspect includes a method associated with a Group III-Nitride transistor with at least one back barrier structure and at least one buried p-type layer.

One general aspect includes a method of implementing a Group III-Nitride transistor with at least one back barrier structure and at least one buried p-type layer.

One general aspect includes a method of making a Group III-Nitride transistor with at least one back barrier structure and at least one buried p-type layer.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
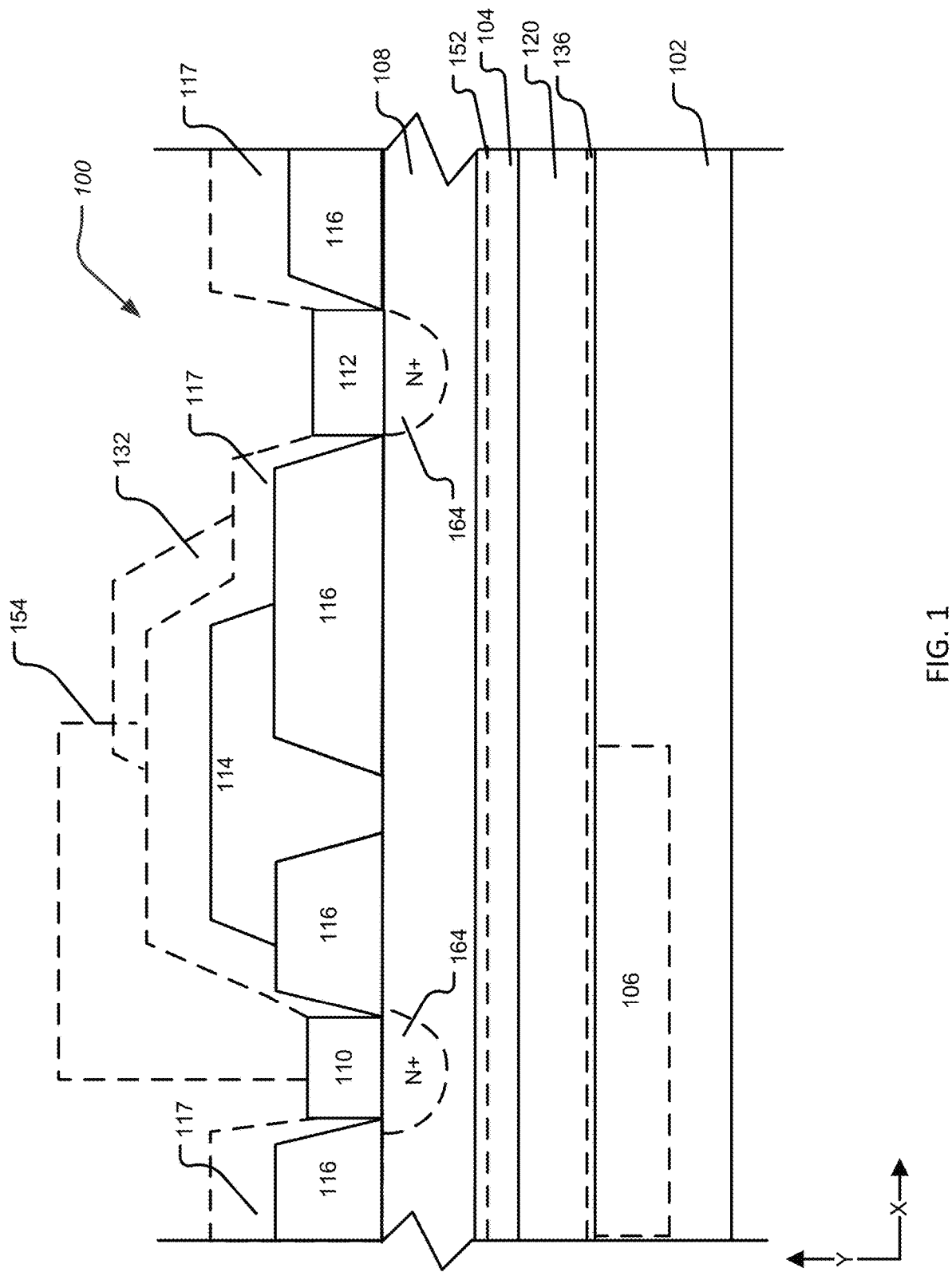
FIG. 1 shows a cross-sectional view of one aspect of a transistor according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different aspects disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also effect operating parameters. Of the characteristics that effect a transistor's operating parameters, the electron mobility, saturated electron drift velocity, electric breakdown field, and thermal conductivity may have an effect on a transistor's high frequency and high power characteristics.

Electron mobility is the measurement of how rapidly an electron is accelerated to its saturated velocity in the presence of an electric field. In the past, semiconductor materials, which had a high electron mobility, were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller ones.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties, which should theoretically allow production of electronic devices that can operate at higher temperatures, higher power, and higher frequency than devices produced from silicon (Si) or gallium arsenide (GaAs) substrates. The high electric breakdown field of about 4×E6 V/cm, high saturated electron drift velocity of about 2.0×E7 cm/sec and high thermal conductivity of about 4.9 W/cm-° K. indicate that SiC would be suitable for high frequency and high power applications. In some aspects, the transistor of the disclosure comprises Si, GaAs or other suitable substrates.

GaN based HEMTs are very promising candidates for high power RF applications, both in discrete and MMIC forms. GaN HEMT designs may use buffer layers that include traps to achieve desired breakdown. However, these traps may cause memory effects that adversely affect performance. To overcome this limitation, structures with buried p layers may be utilized to enable obtaining breakdown with minimal trapping. These devices show reduction and/or elimination of drain lag effect and the part of trapping associated with that effect. However, they still show some trapping associated with what is called a "gate lag effect," particularly at high negative gate voltages.

More specifically, overall lag in transistors such as GaN based HEMTs may be a combination of both gate lag effect and drain lag effect. In particular aspects, implementing various approaches to reduce a first type of lag effect may result in a second type of lag effect becoming more prevalent, increasing, becoming more pronounced, and/or the like. Accordingly, addressing overall lag in transistors such as GaN based HEMTs may require implementation of structures to reduce the first type of lag effect, which results in the second type of lag effect becoming more prevalent, increasing, more pronounced, and/or the like, which may require additional structures to address the second type of lag effect. In a particular aspect, addressing overall lag in transistors such as GaN based HEMTs may require implementation of drain lag reduction structures and/or processes to reduce the drain lag effect and additional gate lag reduction structures and/or processes to reduce the gate lag effect.

The disclosure includes devices and/or processes that provide a systematic approach to reducing lag. More specifically, the disclosure includes devices and/or processes implementing drain lag reduction structures and/or processes to reduce the drain lag effect and additional gate lag reduction structures and/or processes to reduce the gate lag effect.

The disclosure includes devices and/or processes with structures using buried p layers to reduce trapping in GaN HEMTs. These devices and/or processes have been found to greatly reduce and/or eliminate drain lag associated trapping and also gate lag trapping during a limited operational envelope. For example, up to about −8V (volts) reverse bias on the gate for certain implementations of a GaN HEMT. However, outside the limited operational envelope, gate lag trapping effects may be present. For example, when the gate voltage goes below −8V. This gate lag can be undesirable in some applications and needs to be reduced or eliminated.

Simulations have indicated that this gate lag effect arises due to injection and trapping of electrons in the buffer at large negative gate voltages when using conventional buffer structures. For example, the injection and trapping of electrons in the buffer at large negative gate voltages when using conventional buffer structures with unintentionally doped GaN.

The disclosure includes devices and/or processes for reducing and/or limiting gate lag effect. For example, the disclosure includes devices and/or processes for using a low aluminum (Al) concentration Aluminum Gallium Nitride (AlGaN) buffer to provide a barrier to reduce electron injection into the buffer. For example, about 4% Al concentration AlGaN buffer to provide a barrier to reduce electron injection into the buffer. Simulations clearly show that gate lag is reduced using the disclosed buffer layers. In particular, in certain implementations simulations clearly show that gate lag is reduced using the disclosed buffer layers at least down to −15V gate bias.

In addition, the disclosure includes devices and/or processes for reducing and/or limiting gate lag effect by implementing epitaxial growth to reduce incorporation of background impurities such as silicon (Si), oxygen (O), carbon (C), and/or the like in the buffers such as the disclosed AlGaN buffers. Incorporation of a high concentration of high level background impurities has been found to be a problem when using AlGaN back barriers. The disclosed devices and/or processes may be implemented such that impurity incorporation is significantly reduced. More specifically, aspects of the disclosure may implement a back barrier with low background impurity levels. In one aspect, the disclosure may implement an AlGaN back barrier with low background impurity levels. In this regard, impurities have been found to build complexes with dislocations, such as point defects, which also act as deep trap levels.

When growing GaN on SiC, a high density of threading dislocation may be formed due to lattice mis-match. These defects may cause current leakage, low break down voltage, carrier traps, and/or the like. Another source of defects may be impurities, which may act as non-intentional doping and create trap centers and/or the like. To prevent deep penetration of electrons in the GaN buffer, AlGaN buffers may be used to confine electrons in the GaN channel close to the AlGaN barrier.

The devices and/or processes of the disclosure may include a buried P-layer structure in transistor implementations, such as GaN HEMT devices, and shows very positive results where drain lag has been greatly reduced and/or eliminated. However, these devices still suffer from the gate lag effect. For example, these devices still suffer from the gate lag effect at elevated negative gate voltages. Traps in the buffer may cause this delay in the response. Simulation shows that an AlGaN buffer with very low background impurity levels of Carbon, Silicon, Oxygen, and/or the like grown on a Buried p-layer substrate, may dramatically improve the electron confinement and reduce and/or eliminate gate lag as well as may reduce and/or eliminate overall lag.

FIG. 1 shows a cross-sectional view of an aspect of a transistor according to the disclosure.

In particular, FIG. 1 shows a cross-sectional view of a transistor 100. The transistor 100 may include a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be 1E15/cm$^3$ or less. In one aspect, the substrate layer 102 may be formed of SiC selected from the group of 6H, 4H, 15R, 3C SiC, or the like. In one aspect, the substrate layer 102 may be formed of SiC that may be semi-insulating and doped with vanadium or any other suitable dopant or undoped of high purity with defects providing the semi-insulating properties.

In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials. In particular aspects, the substrate layer 102 may include a planar upper surface that is generally parallel to an X axis as illustrated in FIG. 1 and/or is generally parallel to an Z axis (perpendicular to the X axis and the Y axis). In particular aspects, the substrate layer 102 may include a planar lower surface that is generally parallel to an X axis as illustrated in FIG. 1 and/or is generally parallel to an Z axis (perpendicular to the X axis and the Y axis). Where upper and lower are defined along the Y axis.

The transistor 100 may include a buried p-region or p-type material layer 106 that may be formed within the substrate layer 102. The p-type material layer 106 may be configured to form at least in part a drain lag reduction structure, a drain lag elimination structure, and/or the like. The p-type material layer 106 may be provided solely in the substrate layer 102, may extend from the substrate layer 102 to epitaxial layers within the transistor 100, and/or may be located solely in the epitaxial layers of the transistor 100. The dopants can be incorporated into the epitaxial layers by ion implantation alone, through epitaxial growth, a combination of both, and/or the like. The p-type material layer 106 can span multiple layers and include multiple areas of different or graded p-doping. In accordance with other aspects of the disclosure, the p-type material layer 106 may also be formed below a barrier layer 108 between the barrier layer 108 and the substrate layer 102 and/or within the substrate layer 102.

In accordance with aspects of the disclosure, at least some portions of the substrate layer 102 may include the p-type material layer 106. In accordance with aspects of the disclosure, the p-type material layer 106 may be formed by ion implantation of aluminum (Al) and annealing. In other aspects, the p-type material layer 106 may be formed by ion implantation of boron, gallium, or any other material that may form a p-type layer or a combination of these. In one aspect, the p-type material layer 106 may be formed by implantation and annealing of Al prior to the growth of any GaN layers. In one aspect, the ion implantation may utilize channeling implants. In one aspect, the channeling implants may include aligning the ion beam to the substrate layer 102. Alignment of the ion beam may result in increased implanting efficiency. In other aspects, the ion implantation may not utilize channeling.

Aspects of the disclosure may utilize implant channeling to controllably form implanted regions of the p-type material layer 106 in silicon carbide implementations of the substrate layer 102 that are highly uniform by depth and also result in reduced lattice damage. Channeling is experienced when ions are implanted along a crystal axis of the substrate layer 102. When a direction of implantation is close to a major axis of the crystal lattice, the atoms in the crystal lattice appear to "line up" relative to the direction of implantation, and the implanted ions appear to travel down the channels created by the crystal structure to form the p-type material layer 106. This reduces the likelihood of collisions between the implanted ions and the atoms in the crystal lattice. As a result, the depth of the implant of the p-type material layer 106 may be greatly increased.

In general, channeling occurs in silicon carbide when the direction of implantation is within about ±0.2° of a crystallographic axis of the silicon carbide crystal. In some aspects, the implantation may be greater than ±0.2° of the crystallographic axis of the silicon carbide crystal, however the implantation may be less effective. For example, when the direction of implantation is more than about ±0.2° of a crystallographic axis of the silicon carbide crystal, the atoms in the lattice may appear to be randomly distributed relative to the direction of implantation, which may reduce channeling effects. As used herein, the term "implant angle" refers to the angle between the direction of implantation and a crystallographic axis, such as the c-axis or <0001> axis, of the semiconductor layer into which ions are implanted. Thus, an implant angle of less than about 2° relative to the c-axis of a silicon carbide layer may be expected to result in channeling. However, other implant angles may be utilized as well.

In one aspect, the p-type material layer 106 may be formed by ion implantation of $^{27}$Al in 4H-SiC implanted with channeling conditions with an implant energy of $E_1$=100 keV with a dose of 1E13 cm$^2$ at 25° C. In one aspect, the p-type material layer 106 may be formed by ion implantation of $^{27}$Al in 4H—SiC implanted with channeling conditions with an implant energy of $E_2$=300 keV with a dose of 1E13 cm$^2$ at 25° C. However, other implant energies and doses are contemplated as well. For example, in some aspects the implant energy may be 20 keV to 80 keV, 80 keV to 120 keV, 120 keV to 160 keV, 160 keV to 200 keV, 200 keV to 240 keV, 240 keV to 280 keV, 280 keV to 340 keV, 340 keV to 400 keV, 20 keV to 400 keV, and/or 80 keV to 340 keV; and in some aspects the implant dose may be 0.6E13 cm$^2$ to 0.8E13 cm$^2$, 0.8E13 cm$^2$ to 1.2E13 cm$^2$, 1.2E13 cm$^2$ to 1.6E13 cm$^2$, 1.6E13 cm$^2$ to 2E13 cm$^2$, 0.6E13 cm$^2$ to 2E13 cm$^2$, and/or 0.8E13 cm$^2$ to 1.2E13 cm$^2$. Additionally, it should be noted that the p-type material layer 106 may be formed by implantation of other materials such as Boron (B), Gallium (Ga), and/or the like, and may be followed by a high temperature anneal.

In one aspect, the ion implantation may result in the p-type material layer 106 being a deep layer. In one aspect, the ion implantation may result in the p-type material layer 106 having a thickness of 1 μm or less. In one aspect, the ion implantation may result in the p-type material layer 106 having a thickness of 0.7 μm or less. In one aspect, the ion implantation may result in the p-type material layer 106 having a thickness of 0.5 μm or less. In one aspect, the ion implantation may result in the p-type material layer 106 having a thickness of 0.3 μm to 0.5 μm. In one aspect, the ion implantation may result in the p-type material layer 106 having a thickness of 0.2 μm to 0.6 μm. In one aspect, the ion implantation may result in the p-type material layer 106 having a thickness of 0.4 μm to 0.6 μm. In one aspect, the ion implantation may result in the p-type material layer 106 having a thickness of 0.6 μm to 0.8 μm. In one aspect, the ion implantation may result in the p-type material layer 106 having a thickness of 0.6 μm to 1.6 μm. In one aspect, the ion implantation may result in the p-type material layer 106 having a thickness of 0.6 μm to 2.1 μm. In one aspect, the ion implantation may result in the p-type material layer 106 having a thickness of 1 μm to 5 μm. In one aspect, the p-type material layer 106 implantation and/or doping may be in the range of 5E15 to 5E17 per cm$^3$ and extend to depths up to 5 μm.

In one aspect, the ion implantation may result in the p-type material layer 106 having a thickness of 0.05% to 0.3% of a thickness of the substrate layer 102. In one aspect, the ion implantation may result in the p-type material layer 106 having a thickness of 0.05% to 0.1% of a thickness of the substrate layer 102. In one aspect, the ion implantation may result in the p-type material layer 106 having a thickness of 0.1% to 0.15% of a thickness of the substrate layer 102. In one aspect, the ion implantation may result in the p-type material layer 106 having a thickness of 0.15% to 0.2% of a thickness of the substrate layer 102. In one aspect, the ion implantation may result in the p-type material layer 106 having a thickness of 0.2% to 0.25% of a thickness of the substrate layer 102. In one aspect, the ion implantation may result in the p-type material layer 106 having a thickness of 0.25% to 0.3% of a thickness of the substrate layer 102.

The p-type material layer 106 may be implanted within the substrate layer 102 and may be subsequently annealed. Annealing may allow for the implantation to be activated. In one aspect, a masking layer material may be utilized during implantation. In some aspects, during annealing of the p-type material layer 106, a cap layer material may be used to cover the wafer surface to prevent dissociation of the substrate at high temperatures. Once the p-type material layer 106 has been formed, the masking layer material may be removed. Annealing may be performed at a temperature range of 1500-1850° C. for 5 minutes-30 minutes. Other annealing time and temperature profiles are contemplated as well.

In some aspects, the substrate layer 102 may be made of a p-type material SiC substrate. Further in this aspect, the substrate layer 102 being a p-type material SiC substrate may be subsequently subjected to the processes as described herein including implantation of additional p-type layers. In aspects of the transistor 100 of the disclosure, the p-type material layer 106 may be neutralized to limit the length of the p-type material layer 106. In one aspect, neutralizing may include implantation of impurities. In one aspect, neutralizing the p-type material layer 106 may include absorbing the charge of the p-type material layer 106 with a material of opposite polarity. Another way to limit the length of the p-type material layer 106 may be to etch the p-type material layer 106. Another way to limit the length of the p-type material layer 106 may be to use a masking material to limit the area for implantation.

In aspects of the transistor 100 of the disclosure, the p-type material layer 106 may be formed by growing the p-type material layer 106. Growth may be epitaxial, for example. To limit the length of the p-type material layer 106, the p-type material layer 106 may be etched or otherwise neutralized. In aspects of the transistor 100 of the disclosure, the substrate layer 102 may be etched and the p-type material layer 106 may be formed by growing the p-type material layer 106. In one aspect, the growth may be epitaxial.

In aspects of the transistor 100 of the disclosure, the p-type material layer 106 may be an epitaxial layer and may be GaN. In some aspects, the p-type material layer 106 may be an epitaxial layer and may be GaN and the p-type material layer 106 may include magnesium (Mg), carbon (C), and/or Zinc. In some aspects, the p-type material layer 106 may be an epitaxial layer and may be GaN and the p-type material layer 106 may include implantation of magnesium (Mg), carbon (C), and/or Zinc.

In aspects of the transistor 100 of the disclosure, the substrate layer 102 may be etched and the p-type material layer 106 may be formed by growing the p-type material layer 106. In one aspect, the growth may be epitaxial. In aspects of the transistor 100 of the disclosure, the p-type material layer 106 may be an epitaxial layer formed of SiC. In some aspects, the p-type material layer 106 may be an epitaxial layer and may be SiC and the p-type material layer 106 may include Al and/or Br. In some aspects, the p-type material layer 106 may be an epitaxial layer and may be SiC and the p-type material layer 106 may include implantation of Al and/or Br.

In some aspects, the p-type material layer 106 may be under 0.6 μm in thickness. In some aspects, the p-type material layer 106 may be under 0.5 μm in thickness. In some aspects, the p-type material layer 106 may be under 0.4 μm in thickness. In some aspects, the p-type material layer 106 may be under 0.3 μm in thickness. In some aspects, the p-type material layer 106 may be under 0.2 μm in thickness. In some aspects, the p-type material layer 106 may be between 0.1 and 0.6 μm in thickness. In some aspects, the p-type material layer 106 may be between 0.5 and 0.6 μm in thickness. In some aspects, the p-type material layer 106 may be between 0.4 and 0.5 μm in thickness. In some aspects, the p-type material layer 106 may be between 0.3 and 0.4 μm in thickness. In some aspects, the p-type material layer 106 may be between 0.2 and 0.3 μm in thickness. In some aspects, the p-type material layer 106 may be between 0.1 and 0.3 μm in thickness. In some aspects, the p-type material layer 106 may be between 0.05 and 0.25 μm in thickness. In some aspects, the p-type material layer 106 may be between 0.15 and 0.25 μm in thickness.

In aspects of the transistor 100 of the disclosure, the p-type material layer 106 may be a graded layer. In one aspect, the p-type material layer 106 may be a step-graded layer. In one aspect, the p-type material layer 106 may be multiple layers. In particular aspects, the p-type material layer 106 may include a planar upper surface that is generally parallel to an X axis as illustrated in FIG. 1 and/or is generally parallel to an Z axis (perpendicular to the X axis and the Y axis). In particular aspects, the p-type material layer 106 may include a planar lower surface that is generally parallel to an X axis as illustrated in FIG. 1 and/or is generally parallel to an Z axis (perpendicular to the X axis and the Y axis). Where upper and lower are defined along the Y axis.

Depending on the material of the substrate layer 102, a nucleation layer 136 may be formed on the substrate layer 102 to reduce a lattice mismatch between the substrate layer 102 and a next layer in the transistor 100. In one aspect, the nucleation layer 136 may be formed directly on the substrate layer 102. In aspects, the nucleation layer 136 may be formed on the substrate layer 102 with intervening layer(s), such as SiC epitaxial layer(s) formed on a SiC implementation of the substrate layer 102. In aspects, the nucleation layer is Aluminum Nitride (AlN), such as undoped AlN.

The nucleation layer 136 may include or may be different suitable materials, such as a Group III-Nitride material. For example, $Al_xIn_{y1-x-y}GaN$ (where $0<=x<=1$, $0<=y<=1$, $x+y<=1$), AlGaN, undoped AlGaN, and/or the like. The nucleation layer 136 may be formed on the substrate layer 102 using known semiconductor growth techniques such as Metal Oxide Chemical Vapor Deposition (MOCVD), Hydride Vapor Phase Epitaxy (HVPE), Molecular Beam Epitaxy (MBE), or the like.

In aspects of the transistor 100 of the disclosure, a back barrier layer 120 may be formed directly on the nucleation layer 136 or on the nucleation layer 136 with intervening layer(s). In aspects of the transistor 100 of the disclosure, a back barrier layer 120 may be formed directly on the substrate layer 102 or on the substrate layer 102 with intervening layer(s). In particular, the back barrier layer 120 may be configured at least in part as a gate lag reduction structure, a gate lag elimination structure, and/or the like. In particular, the back barrier layer 120 configured at least in part as a gate lag reduction structure, a gate lag elimination structure, and/or the like in conjunction with the p-type material layer 106 configured at least in part as a drain lag reduction structure, a drain lag elimination structure, and/or the like may operate together in a synergistic manner to reduce overall lag of the transistor 100. As further described herein, this synergistic overall reduction of lag of the transistor 100 was an unexpected result of the combined structures of the back barrier layer 120 and the p-type material layer 106.

More specifically, the transistor 100 in conjunction with the p-type material layer 106 and the back barrier layer 120 as disclosed, associated structures thereof, and/or associated processes thereof, may provide a systematic approach to reducing lag. More specifically, the transistor 100 of the disclosure may implement the p-type material layer 106 and/or processes thereof as a drain lag reduction structure and/or process to reduce the drain lag effect and the transistor 100 of the disclosure may implement the back barrier layer 120 and/or processes thereof as a gate lag reduction structure and/or process to reduce the gate lag effect.

In this regard, it has been determined that impurities such as silicon, oxygen, carbon, and/or the like in the back barrier layer 120 may increase gate lag. In particular, that impurities provide trapping, leaking, and/or the like. More specifically, aspects of the disclosure may implement the back barrier layer 120 with low background impurity levels. In one aspect, the disclosure may implement AlGaN for the back barrier layer 120 with low background impurity levels. In this regard, impurities have been found to build complexes with dislocations, such as point defects, which also act as deep trap levels.

More specifically, the disclosure may implement AlGaN for the back barrier layer 120 with low background impurity levels where low background impurity levels may be defined as impurities less than 1E17 per cubic cm. (centimeter), less than 5E16 per cubic cm., less than 1E16 per cubic cm., or less than 1E15 per cubic cm. Moreover, the disclosure may implement AlGaN for the back barrier layer 120 with low background impurity levels of silicon, oxygen, carbon, and/or the like where low background impurity levels of silicon, oxygen, carbon, and/or the like may be defined as impurities of silicon, oxygen, carbon, and/or the like less than 1E17 per cubic cm. (centimeter), less than 5E16 per cubic cm., less than 1E16 per cubic cm., or less than 1E15 per cubic cm.

Moreover, the disclosure may implement AlGaN for the back barrier layer 120 with low background impurity levels of silicon and oxygen where low background impurity levels of silicon and oxygen may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of silicon and oxygen where low background impurity levels of silicon and oxygen may be defined as impurities of silicon and oxygen less than 1E16. Moreover, the disclosure may implement AlGaN for the back barrier layer 120 with low background impurity levels of carbon where low background impurity levels of carbon may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of carbon where low background impurity levels of carbon may be defined as impurities of carbon less than 5E16.

Additionally or alternatively, low background impurity levels may be defined as impurities between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon, oxygen, carbon, and/or the like between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of carbon between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

Additionally, the back barrier layer 120 may be configured to provide a sharp interface to the channel layer 104. This interface may function as a barrier for electrons. In aspects of the transistor 100 of the disclosure, the back barrier layer 120 may be a graded layer. In one aspect, the back barrier layer 120 may be a step-graded layer. In one aspect, the back barrier layer 120 may be multiple layers.

In particular aspects, the back barrier layer 120 may be a low Al concentration AlGaN buffer layer to provide a barrier to reduce electron injection into the buffer layer. In this regard, the barrier to reduce electron injection into the buffer layer results in a gate lag reduction structure, a gate lag elimination structure, and/or the like. For example, the back barrier layer 120 may be implemented with about 4% Al concentration AlGaN to provide a barrier to reduce electron injection into the buffer. In this regard, about may be within 0.5%, 1%, 1.5%, or 2%. In particular aspects, the back barrier layer 120 may be implemented with AlGaN with an Al concentration of 1% to 6%, 1% to 1.5%, 1.5% to 2%, 2% to 2.5%, 2.5% to 3%, 3% to 3.5%, 3.5% to 4%, 3.5% to 4.5%, 3.8% to 4.2%, 4% to 4.5%, 4.5% to 5%, 5% to 5.5%, or 5.5% to 6%, to provide a barrier to reduce electron injection into the buffer, a gate lag reduction structure, a gate lag elimination structure, and/or the like.

In aspects, the transistor 100 may have limited gate lag during a limited operational envelope. For example, up to about −8V (volts) reverse bias on the gate for certain implementations of a GaN HEMT. However, the back barrier layer 120 may be configured as a gate lag reduction, a gate lag elimination, and/or the like for implementations outside the limited operational envelope where gate lag trapping effects may be present. For example, implementations of the transistor 100 where the gate voltage goes below −8V. In particular, the back barrier layer 120 configured at least in part as a gate lag reduction structure, a gate lag elimination structure, and/or the like in conjunction with the p-type material layer 106 configured at least in part as a drain lag reduction structure, a drain lag elimination structure, and/or the like operate together in a synergistic manner to reduce overall lag of the transistor 100 during such low gate voltage conditions. As further described herein, this synergistic overall reduction of lag of the transistor 100 was an unexpected result of the combined structures of the back barrier layer 120 and the p-type material layer 106.

Additionally, the back barrier layer 120 of the transistor 100 may be further configured and/or processed to reduce and/or limit gate lag effect by implementing epitaxial growth thereof. In particular, the back barrier layer 120 of the transistor 100 may be further configured and/or processed to reduce and/or limit gate lag effect by implementing epitaxial growth while reducing incorporation of background impurities such as silicon (Si), oxygen (O), carbon (C), and/or the like in the AlGaN of implementations of the back barrier layer 120. More specifically, aspects of the disclosure may implement the back barrier layer 120 with low background impurity levels. In one aspect, the disclosure may implement AlGaN for the back barrier layer 120 with low background impurity levels. In this regard, impurities have been found to build complexes with dislocations, such as point defects, which also act as deep trap levels. In this regard, incorporation in the back barrier layer 120 of a high concentration of high level background impurities has been found to be a problem when using AlGaN for the back barrier layer 120. The back barrier layer 120 may implement epitaxial growth with impurity incorporation significantly reduced. More specifically, the back barrier layer 120 may be implemented with epitaxial growth of AlGaN reducing incorporation of background impurities such as silicon (Si), oxygen (O), carbon (C), and/or the like.

More specifically, the disclosure may implement AlGaN for the back barrier layer 120 with low background impurity levels where low background impurity levels may be defined as impurities less than 1E17 per cubic cm. (centimeter), less than 5E16 per cubic cm., less than 1E16 per cubic cm., or less than 1E15 per cubic cm. Moreover, the disclosure may implement AlGaN for the back barrier layer 120 with low background impurity levels of silicon, oxygen, carbon, and/or the like where low background impurity levels of silicon, oxygen, carbon, and/or the like may be defined as impurities of silicon, oxygen, carbon, and/or the like less than 1E17 per cubic cm. (centimeter), less than 5E16 per cubic cm., less than 1E16 per cubic cm., or less than 1E15 per cubic cm.

Moreover, the disclosure may implement AlGaN for the back barrier layer 120 with low background impurity levels of silicon and oxygen where low background impurity levels of silicon and oxygen may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of silicon and oxygen where low background impurity levels of silicon and oxygen may be defined as impurities of silicon and oxygen less than 1E16. Moreover, the disclosure may implement AlGaN for the back barrier layer 120 with low background impurity levels of carbon where low background impurity levels of carbon may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of carbon where low background impurity levels of carbon may be defined as impurities of carbon less than 5E16.

Additionally or alternatively, low background impurity levels may be defined as impurities between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon, oxygen, carbon, and/or the like between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of carbon between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In this regard, it has been discovered that a source of defects may be impurities, which may act as non-intentional doping and create trap centers and/or the like in the transistor 100. To prevent deep penetration of electrons in the GaN buffer of the transistor 100 or the channel layer 104 of the transistor 100, the back barrier layer 120 may be implemented as an AlGaN buffer as described herein and may be used to confine electrons in the channel layer 104 close to the back barrier layer 120. The disclosed implementation and configuration of the back barrier layer 120 has additionally proven to improve break-down voltage in the transistor 100 and/or GaN HEMT implementations of the transistor 100.

Accordingly, the transistor 100 may include the p-type material layer 106 as described herein in order for drain lag to be greatly reduced and/or eliminated. However, the transistor 100 may still suffer from the gate lag effect. For example, the transistor 100 may still suffer from the gate lag effect at elevated negative gate voltages. Traps in the buffer of the transistor 100 may be a cause this delay. Accordingly, the back barrier layer 120 may be implemented with AlGaN with very low background impurity levels of Carbon, Silicon, Oxygen, and/or the like grown on the p-type material layer 106 to dramatically improve the electron confinement and reduce and/or eliminate gate lag as well as may reduce and/or eliminate overall lag.

In particular aspects, the back barrier layer 120 may include a planar upper surface that is generally parallel to an X axis as illustrated in FIG. 1 and/or is generally parallel to an Z axis (perpendicular to the X axis and the Y axis). In particular aspects, the back barrier layer 120 may include a planar lower surface that is generally parallel to an X axis as illustrated in FIG. 1 and/or is generally parallel to an Z axis (perpendicular to the X axis and the Y axis). Where upper and lower are defined along the Y axis.

In some aspects, a channel layer 104 may be formed directly on the back barrier layer 120 or on the back barrier layer 120 with intervening layer(s). In one aspect, the channel layer 104 is formed of GaN.

Depending on the aspect, the channel layer 104 may be formed of different suitable materials such as a Group III-nitride such as $Al_xGa_yIn_{(1-x-y)}N$ (where $0<=x<=1$, $0<=y<=1$, $x+y<=1$), e.g., GaN, AlGaN, AlN, and the like, or another suitable material. The channel layer 104 or portions thereof may be doped with dopants, such as, Fe and/or C or alternatively can be wholly or partly undoped.

In particular aspects, the channel layer 104 may include a planar upper surface that is generally parallel to an X axis as illustrated in FIG. 1 and/or is generally parallel to an Z axis (perpendicular to the X axis and the Y axis). In particular aspects, the channel layer 104 may include a planar lower surface that is generally parallel to an X axis as illustrated in FIG. 1 and/or is generally parallel to an Z axis (perpendicular to the X axis and the Y axis). Where upper and lower are defined along the Y axis.

In one aspect, the channel layer 104 may be high purity GaN. In one aspect, the channel layer 104 may be high purity GaN that may be a low-doped n-type. In one aspect, a combined thickness of the channel layer 104 and the back barrier layer 120 may have a thickness defined as a distance between an upper surface of the substrate layer 102 and a lower surface of the barrier layer 108. In one aspect, a combined thickness of the channel layer 104 and the back barrier layer 120 along the Y axis between an upper surface of the channel layer 104 and a lower surface the back barrier layer 120 may be 10%-20%, 20%-30%, 30%-40%, 40%-50%, 50%-60%, 60%-70%, 70%-80%, or 80%-90% of a thickness of the substrate layer 102. In one aspect, a combined thickness of the channel layer 104 and the back barrier layer 120 may be less than 0.8 microns, less than 0.7 microns, less than 0.6 microns, less than 0.5 microns, or less than 0.4 microns. In one aspect, a combined thickness of the channel layer 104 and the back barrier layer 120 may have a range of 0.8 microns to 0.6 microns, 0.7 microns to 0.5 microns, 0.6 microns to 0.4 microns, 0.5 microns to 0.3 microns, 0.4 microns to 0.2 microns, or 0.7 microns to 0.3 microns. In one aspect, the back barrier layer 120 may be thicker than the channel layer 104 along the Y axis between an upper surface and lower surface of each. In one aspect, the back barrier layer 120 may be 10%, 20%, 30%, 40%, 50%, 60%, 70%, 80%, 90%, 100%, 120%, 140%, or 160% thicker than the channel layer 104 along the Y axis between an upper surface and lower surface of each. In one aspect, the back barrier layer 120 may be 10%-20%, 20%-30%, 30%-40%, 40%-50%, 50%-60%, 60%-70%, 70%-80%, 80%-90%, 90%-100%, 100%-120%, 120%-140%, or 140%-160% thicker than the channel layer 104 along the Y axis between an upper surface and lower surface of each.

In one aspect, the transistor 100 may have an intervening layer(s) thickness defined as a length between an upper surface of the substrate layer 102 and a lower surface of the barrier layer 108. In one aspect, the intervening layer(s) thickness may be less than 0.8 microns, less than 0.7 microns, less than 0.6 microns, less than 0.5 microns, or less than 0.4 microns. In one aspect, the intervening layer(s) thickness may have a range of 0.8 microns to 0.6 microns, 0.7 microns to 0.5 microns, 0.6 microns to 0.4 microns, 0.5 microns to 0.3 microns, or 0.4 microns to 0.2 microns.

The barrier layer 108 may be formed on the channel layer 104. In one aspect, the barrier layer 108 may be formed directly on the channel layer 104, and in other aspects, the barrier layer 108 is formed on the channel layer 104 with intervening layer(s). Depending on the aspect, the channel layer 104 may be formed of different suitable materials such as a Group III-nitride such as $Al_xGa_yIn_{(1-x-y)}N$ (where $0<=x<=1$, $0<=y<=1$, $x+y<=1$), e.g., AlGaN, AlN, or InAlGaN, or another suitable material. In one aspect, the barrier layer 108 may be AlGaN, and in another aspect the barrier layer 108 is AlN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In particular aspects, the barrier layer 108 may include a planar upper surface that is generally parallel to an X axis as illustrated in FIG. 1 and/or is generally parallel to an Z axis (perpendicular to the X axis and the Y axis). In particular aspects, the barrier layer 108 may include a planar lower surface that is generally parallel to an X axis as illustrated in FIG. 1 and/or is generally parallel to an Z axis (perpendicular to the X axis and the Y axis). Where upper and lower are defined along the Y axis.

In one aspect, a bandgap of the channel layer 104 may be less than a bandgap of the barrier layer 108 to form a two-dimensional electron gas (2DEG) at a heterointerface 152 between the channel layer 104 and barrier layer 108 when biased at an appropriate level. In one aspect, a bandgap of the channel layer 104 that may be GaN may be less than a bandgap of the barrier layer 108 that may be AlGaN to form the two-dimensional electron gas (2DEG) at a heterointerface 152 between the channel layer 104 and barrier layer 108 when biased at an appropriate level.

In aspects of the disclosure, the heterointerface 152 may be between the barrier layer 108 and the channel layer 104. In one aspect, source 110 and drain 112 electrodes may be formed making ohmic contacts such that an electric current flows between the source 110 and the drain 112 electrodes via a two-dimensional electron gas (2DEG) induced at the heterointerface 152 between the channel layer 104 and barrier layer 108 when a gate 114 electrode is biased at an appropriate level. In one aspect, the heterointerface 152 may be in the range of 0.005 µm to 0.007 µm, 0.007 µm to 0.009 µm, and 0.009 µm to 0.011 µm.

In one aspect, the source 110, the drain 112 and the gate 114 may be formed on the barrier layer 108. The source 110, the drain 112, and/or the gate 114 may be arranged directly on the barrier layer 108 or may be on intervening layer(s) on the barrier layer 108, such as an AlGaN layer on an AlN barrier layer. Other or additional intervening layers are possible. For example, a spacer layer 116 of SiN, AlO, SiO, $SiO_2$, AlN, or the like or combinations thereof can be provided on the barrier layer 108 or other intervening layers. In one aspect, the barrier layer 108 may include a region 164 under the source 110 and/or the drain 112 that is a N+ material. In one aspect, the barrier layer 108 may include a region 164 under the source 110 and/or drain 112 that is Si doped. In one aspect, the n-type dopants in the region 164 are implanted.

In one aspect, the source 110, the drain 112 and the gate 114 may be formed on the channel layer 104. The source 110, the drain 112, and/or the gate 114 may be arranged directly on the channel layer 104 or may be on intervening layer(s) on the channel layer 104, such as an AlGaN layer on an AlN barrier layer. In one aspect, the channel layer 104 may include a region 164 under the source 110 and/or the drain 112 that is a N+ material. In one aspect, the channel layer 104 may include a region 164 under the source 110 and/or drain 112 that is Si doped. In one aspect, the n-type dopants in the region 164 are implanted.

In some aspects, the source 110 and the drain 112 may be symmetrical with respect to the gate 114. In some aspects, the source 110 and the drain 112 may be symmetrical with respect to the gate 114. In some aspects, the source 110 and the drain 112 may be asymmetrical with respect to the gate 114. In one aspect, the gate 114 may be a T-shaped gate. In one aspect, the gate 114 may be a non-T shaped gate.

To protect and separate the gate 114 and the drain 112, a spacer layer 116 may be arranged on the barrier layer 108, on a side opposite the channel layer 104, adjacent the gate 114, the drain 112 and the source 110. The spacer layer 116 may be a passivation layer made of SiN, AlO, SiO, $SiO_2$, AlN, or the like, or a combination incorporating multiple layers thereof. In one aspect, the spacer layer 116 is a passivation layer made of SiN. In one aspect, the spacer layer 116 can be deposited using MOCVD, plasma chemical vapor deposition (CVD), hot-filament CVD, or sputtering.

In one aspect, the spacer layer 116 may include deposition of $Si_3N_4$. In one aspect, the spacer layer 116 forms an insulating layer. In one aspect, the spacer layer 116 forms an insulator. In one aspect, the spacer layer 116 may be a dielectric. In one aspect, a spacer layer 116 may be provided on the barrier layer 108. In one aspect, the spacer layer 116 may include non-conducting material such as a dielectric. In one aspect, the spacer layer 116 may include a number of different layers of dielectrics or a combination of dielectric layers. In one aspect, the spacer layer 116 may be many different thicknesses, with a suitable range of thicknesses being approximately 0.05 to 2 microns. In one aspect, the spacer layer 116 may include a material such as a Group III nitride material having different Group III elements such as alloys of Al, Ga, or In, with a suitable spacer layer material being $Al_xIn_yGa_{1-x-y}$ (where 0<=x<=1 and 0<=y<=1, x+y<=1).

In some aspects, the gate 114 may be deposited in a channel formed in the spacer layer 116, and a T-gate may be formed using semiconductor processing techniques understood by those of ordinary skill in the art. Other gate configurations are also possible and contemplated.

In aspects of the transistor 100 of the disclosure, the substrate layer 102 may be silicon carbide and include a carbon face. In one aspect, the substrate layer 102 may be silicon carbide and include a carbon face arranged adjacent the channel layer 104. In one aspect, the substrate layer 102 may be silicon carbide and include a carbon face and the substrate layer 102 may be flipped so as to be arranged adjacent the channel layer 104. In this aspect, the channel layer 104 may be GaN having a nitrogen face adjacent the carbon face of the substrate layer 102. In one aspect, the channel layer 104 may be GaN having alternating GaN and N layers with a N layer and/or a nitrogen face adjacent the carbon face of the substrate layer 102.

In aspects of the transistor 100 of the disclosure, the channel layer 104 may include nonpolar GaN. In one aspect, the channel layer 104 may include semipolar GaN. In one aspect, the channel layer 104 may include hot wall epitaxy. In one aspect, the channel layer 104 may include hot wall epitaxy having a thickness in the range of 0.15 microns to 0.25 microns, 0.2 microns to 0.3 microns, 0.25 microns to 0.35 microns, 0.3 microns to 0.35 microns, 0.35 microns to 0.4 microns, 0.4 microns to 0.45 microns, 0.45 microns to 0.5 microns, 0.5 microns to 0.55 microns, or 0.15 microns to 0.55 microns. The p-type material layer 106 may help avoid breakdowns and problems with material impurities. For example, without a p-type material layer 106, the transistor 100 may need impurities, which do not discharge well. The p-type material layer 106 may be formed beneath the gate 114, and may extend toward the source 110 and the drain 112 of the device.

In aspects of the transistor 100 of the disclosure, the channel layer 104 may be designed to be of the high purity type where the Fermi level is in the upper half of the bandgap, which reduces slow trapping effects normally observed in GaN HEMTs. In this regard, the traps under the Fermi level are filled always and thus slow transients may be prevented. In some aspects, the channel layer 104 may be as thin as possible consistent with achieving good crystalline quality. Applicants have already demonstrated 0.4 μm layers with good quality.

In aspects of the transistor 100 of the disclosure, a $Al_xIn_yGa_{1-x-y}$ (where 0<=x<=1 and 0<=y<=1, x+y<=1) nucleation layer 136 or channel layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer 136 may depend on the material of the substrate layer 102.

In aspects of the transistor 100 of the disclosure, the channel layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

Figure 8:
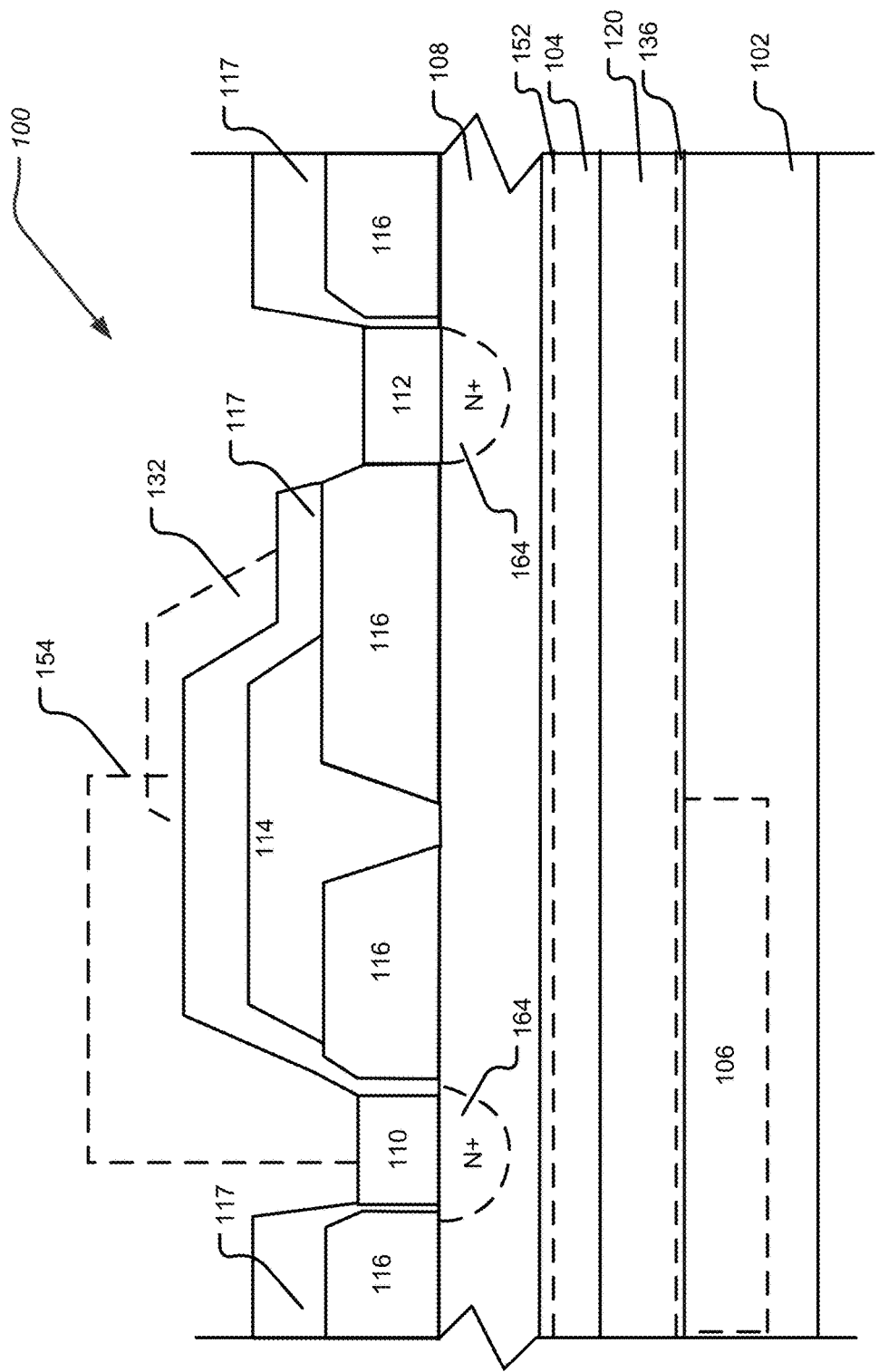
FIG. 8 shows a cross-sectional view of another aspect of a transistor according to the disclosure.

With reference to the description of FIG. 8, the transistor 100 may include a second spacer layer 117 that may be formed on the spacer layer 116 and the gate 114. With reference to the description of FIG. 9, the transistor 100 may include a field plate 132. With reference to the description of FIG. 10, the transistor 100 may include a connection 154 to the field plate 132.

Figure 2:
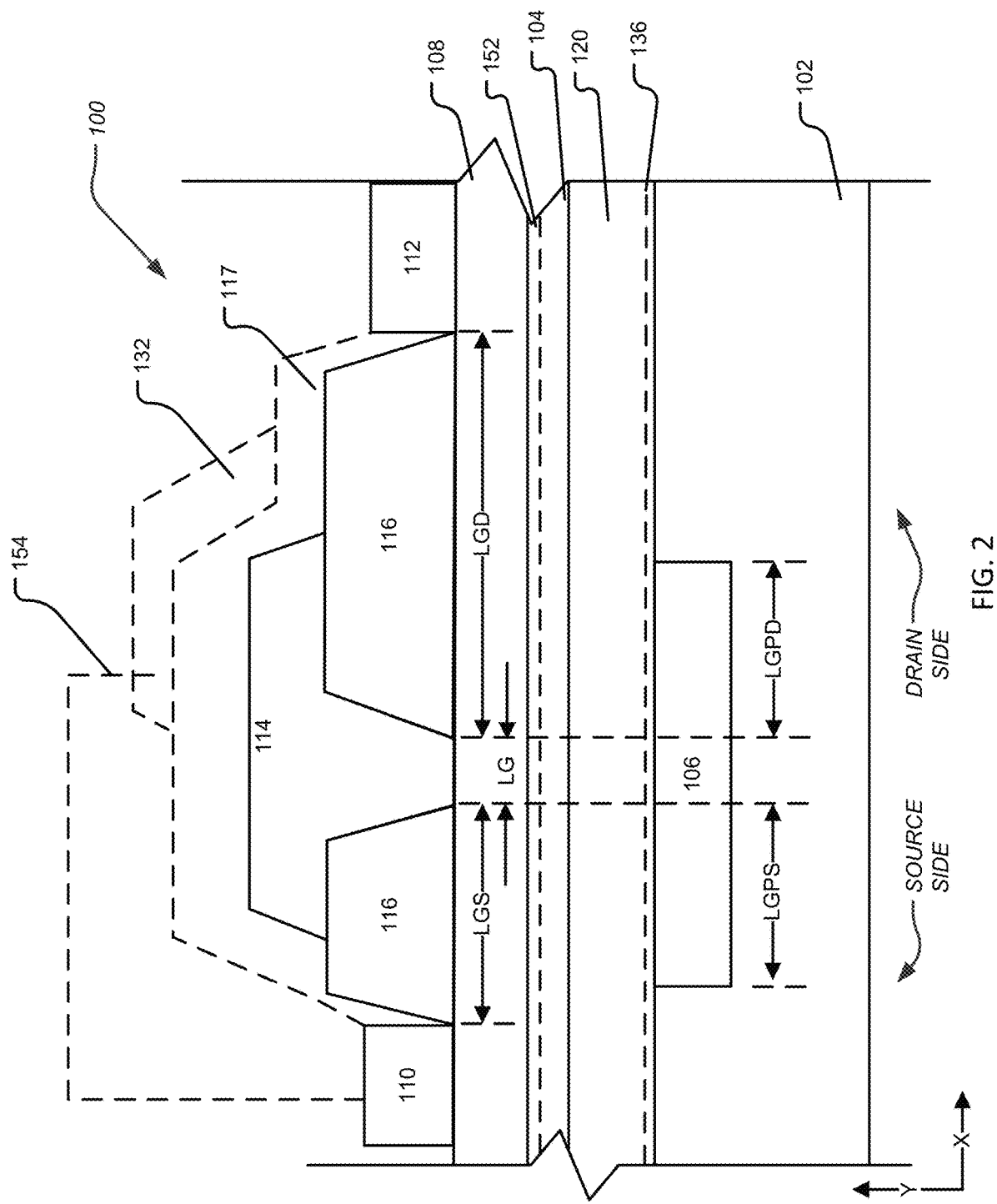
FIG. 2 shows a cross-sectional view of an aspect of the transistor according to FIG. 1.

FIG. 2 shows a cross-sectional view of an aspect of the transistor according to FIG. 1.

In one aspect of the disclosure, the p-type material layer 106 may not extend over the entire area of the transistor 100. In this regard, the p-type material layer 106 may be selectively arranged as described herein, the p-type material layer 106 may be arranged over the entire length and selectively removed as described herein, the p-type material layer 106 may be arranged over the entire length and selectively electrically neutralized as described herein, or the like. Accordingly, the specific constructions of the p-type material layer 106 described below encompass any of these processes that result in the p-type material layer 106 having an operating construction and arrangement as noted below. In other words, the length and/or size of the p-type material layer 106 does not include a part that is partially electrically neutralized, partially etched, or the like. The length and/or size of the p-type material layer 106 may depend on the application of the transistor 100, requirements for the transistor 100, and the like. Limiting a length of the p-type material layer 106 reduces gate lag effect, drain lag effect, avoids adverse effects on RF performance for certain transistor applications, and/or the like.

As shown in FIG. 2, the p-type material layer 106 may be present in limited areas as described in further detail below. In some aspects, the p-type material layer 106 may be present in a gate—source region. In some aspects, the p-type material layer 106 may be present in a gate—source region and also partly under the gate 114. In some aspects, the p-type material layer 106 may be arranged at least partially under the gate 114 and/or the source 110. In some aspects, the p-type material layer 106 may be arranged at least partially under the gate 114 and/or and not arranged under the source 110.

In one aspect, the p-type material layer 106 may be arranged at least partially vertically under the gate 114 along the y-axis and may extend along the x-axis partially toward the source 110 and the drain 112. In this aspect, no portion of the p-type material layer 106 may be located vertically along the y-axis below the source 110; and no portion of the p-type material layer 106 may be located vertically along the y-axis below the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100. In this regard, a source side of the transistor 100 is defined as a side of the transistor 100 extending from the gate 114 toward and past the source 110 as illustrated in FIG. 2; and a drain side of the transistor 100 is defined as a side of the transistor 100 extending from the gate 114 toward and past the drain 112 as illustrated in FIG. 2.

In one aspect, the p-type material layer 106 may be arranged at least partially vertically under the gate 114 along the y-axis and may extend along the x-axis partially toward the source 110 and the drain 112. In this aspect, only a portion of the p-type material layer 106 may be located vertically along the y-axis below the source 110; and no portion of the p-type material layer 106 may be located vertically along the y-axis below the source 110. In this aspect, a portion of the substrate layer 102 may not include the p-type material layer 106 located vertically along the y-axis below the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100.

In one aspect, the p-type material layer 106 may be arranged at least partially vertically under the gate 114 along the y-axis and may extend along the x-axis partially toward the source 110 and the drain 112. In this aspect, a portion of the p-type material layer 106 may be located vertically along the y-axis entirely below the source 110; and no portion of the p-type material layer 106 may be located vertically along the y-axis below the drain 112. In this aspect, a portion of the substrate layer 102 may not include the p-type material layer 106 located vertically along the y-axis past the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100.

In one aspect, the p-type material layer 106 may be arranged vertically under the gate 114 along the y-axis and may extend along the x-axis partially toward the source 110 and the drain 112. In this aspect, a portion of the p-type material layer 106 may be located vertically along the y-axis entirely below the source 110; and no portion of the p-type material layer 106 may be located vertically along the y-axis below the source 110. In this aspect, a portion of the substrate layer 102 may not include the p-type material layer 106 located vertically along the y-axis past the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100.

With reference to FIG. 2, various dimensions of components of the transistor 100 will be described in order to define dimensions of the p-type material layer 106. The gate 114 may have a width LG along a lower surface of the gate 114 that is adjacent the barrier layer 108 that is parallel to the X axis. In particular, the width LG may extend from one lower corner of the gate 114 to the other lower corner of the gate 114. The definition of the width LG is illustrated in FIG. 2. In some aspects, the width LG may be between 0.05 µm and 0.6 µm, 0.5 µm and 0.6 µm, 0.4 µm and 0.5 µm, 0.3 µm and 0.4 µm, 0.2 µm and 0.3 µm, 0.1 µm and 0.2 µm, or 0.1 µm and 0.05 µm in length along the x-axis. In some aspects, a width of the gate 114 above a lower surface may be greater than the width LG as illustrated in FIG. 2.

The distance from the gate 114 to the source 110 may be defined as distance LGS. In particular, the distance LGS may be defined as a distance from a lower corner of the gate 114 on a source side to a lower corner of the source 110 on a gate side. The definition of the distance LGS is illustrated in FIG. 2.

The distance from the gate 114 to the drain 112 may be defined as the distance LGD. In particular, the distance LGD may be defined as a distance from a lower corner of the gate 114 on a drain side to a lower corner of the drain 112 on a gate side. The definition of the distance LGD is illustrated in FIG. 2.

In one aspect, the p-type material layer 106 may extend laterally along the x-axis from at least beneath the lower corner of the gate 114 on a source side toward the source 110 a distance LGPS. The definition of the distance LGPS is illustrated in FIG. 2. In some aspects, the distance LGPS may be between 1 µm and 6 µm, 5 µm and 6 µm, 4 µm and 5 µm, 3 µm and 4 µm, 2 µm and 3 µm, or 1 µm and 3 µm in length along the x-axis.

In one aspect, the p-type material layer 106 may extend laterally along the x-axis from at least beneath the lower corner of the gate 114 on a drain side toward the drain 112 a distance LGPD. In some aspects, the distance LGPD may be between 0.1 µm and 0.6 µm, 0.5 µm and 0.6 µm, 0.4 µm and 0.5 µm, 0.3 µm and 0.4 µm, 0.2 µm and 0.3 µm, or 0.1 µm and 0.3 µm in length along the x-axis.

Accordingly, a length of the p-type material layer 106 may be a sum of the distance LGPD, the width LG, and the distance LGPS. In this regard, a length of the p-type material layer 106 reduces gate lag effect, avoids adverse effects on RF performance for certain transistor applications, and/or the like.

In one aspect, the length LGPS may be 100% to 700% of LG, 100% to 200% of LG, 200% to 300% of LG, 300% to 400% of LG, 400% to 500% of LG, 500% to 600% of LG, or 600% to 700% of LG.

In one aspect, the length LG may be 10% to 180% of LGPD, 10% to 20% of LGPD, 20% to 30% of LGPD, 30% to 40% of LGPD, 40% to 50% of LGPD, 50% to 60% of LGPD, 60% to 70% of LGPD, 70% to 80% of LGPD, 80% to 90% of LGPD, 90% to 100% of LGPD, 100% to 110% of LGPD, 110% to 120% of LGPD, 110% to 130% of LGPD, 130% to 140% of LGPD, 140% to 150% of LGPD, 150% to 160% of LGPD, 160% to 170% of LGPD, or 170% to 180% of LGPD.

In one aspect, the length LGS may be 10% to 180% of LGPS, 10% to 20% of LGPS, 20% to 30% of LGPS, 30% to 40% of LGPS, 40% to 50% of LGPS, 50% to 60% of LGPS, 60% to 70% of LGPS, 70% to 80% of LGPS, 80% to 90% of LGPS, 90% to 100% of LGPS, 100% to 110% of LGPS, 110% to 120% of LGPS, 110% to 130% of LGPS, 130% to 140% of LGPS, 140% to 150% of LGPS, 150% to 160% of LGPS, 160% to 170% of LGPS, or 170% to 180% of LGPS.

In one aspect, the length LG may be 10% to 180% of LGPD, 10% to 20% of LGPD, 20% to 30% of LGPD, 30% to 40% of LGPD, 40% to 50% of LGPD, 50% to 60% of LGPD, 60% to 70% of LGPD, 70% to 80% of LGPD, 80% to 90% of LGPD, 90% to 100% of LGPD, 100% to 110% of LGPD, 110% to 120% of LGPD, 110% to 130% of LGPD, 130% to 140% of LGPD, 140% to 150% of LGPD, 150% to 160% of LGPD, 160% to 170% of LGPD, or 170% to 180% of LGPD.

In one or more aspects, a part of a source side of the substrate layer 102 may be free of the p-type material layer 106. In one or more aspects, a part of a drain side of the substrate layer 102 may be free of the p-type material layer 106. In one or more aspects, a part of a source side of the substrate layer 102 may be free of the p-type material layer 106 and a part of a drain side of the substrate layer 102 may be free of the p-type material layer 106. In one or more aspects, the p-type material layer 106 may be arranged under and across a length of the gate 114 and may extend toward the source 110 and the drain 112.

In one or more aspects, a distance LGD may be a distance from a lower corner of the gate 114 on the drain 112 side to a lower corner of the drain 112 on a gate side; a distance LGS may be a distance from a lower corner of the gate 114 on the source 110 side to a lower corner of the source 110 on a gate side; and the distance LGD may be greater than the distance LGS. In one or more aspects, a distance LGPS may define a length of a portion of the p-type material layer 106 from a lower corner of the gate 114 on the source 110 side toward the source 110; a distance LGPD may define a length of a portion of the p-type material layer 106 from a lower corner of the gate 114 on the drain 112 side toward the drain 112; and the distance LGPS may be equal to the distance LGPD. In one or more aspects, a distance LGPS may define a length of a portion of the p-type material layer 106 from a lower corner of the gate 114 on the source 110 side toward the source 110; a distance LGPD may define a length of a portion of the p-type material layer 106 from a lower corner of the gate 114 on the drain 112 side toward the drain 112; and the distance LGPS may be greater than the distance LGPD. In one or more aspects, a distance LGPS may define a length of a portion of the p-type material layer 106 from a lower corner of the gate 114 on the source 110 side toward the source 110; a distance LGPD may define a length of a portion of the p-type material layer 106 from a lower corner of the gate 114 on the drain 112 side toward the drain 112; and the distance LGPD may be greater than the distance LGPS.

In one or more aspects, the p-type material layer 106 may extend toward the source 110 but does not vertically overlap the source 110. In one or more aspects, the p-type material layer 106 may vertically overlap the source 110. In one or more aspects, the p-type material layer 106 may extend toward the drain 112 but does not vertically overlap the drain 112. In one or more aspects, the p-type material layer 106 may vertically overlap the drain 112. In one or more aspects, the p-type material layer 106 may be electrically connected to the gate 114. In one or more aspects, the gate 114 may be electrically connected to any external circuit or voltage. In one or more aspects, the p-type material layer 106 may have no direct electrical connections. In one or more aspects, the p-type material layer 106 may be electrically connected to the source 110.

In some aspects, part of the voltage from a drain 112 to a source 110 may be dropped in the p-type material layer 106 region. This may also deplete the channel in the lateral direction. The lateral depletion may reduce the lateral field and increase breakdown voltage. Alternatively, a more compact structure can be obtained for a required breakdown voltage. The p-type material layer 106 may eliminate the need to have C or Fe doping of the buffer needed to sustain the applied drain voltage. Elimination of C and Fe leads to decreased current reduction under operating conditions (no trapping). Moreover, in some aspects the p-type material layer 106 may support the field.

In some aspects, the p-type material layer 106 may also be configured to have a varying doping and/or implantation profile perpendicular to the surface. In some aspects, the p-type material layer 106 may also be configured to have a varying profile perpendicular to the surface extending into the cross-sectional views of the Figures. The profile may be configured to achieve desired breakdown voltage, device size, switching time, and the like.

Figure 3:
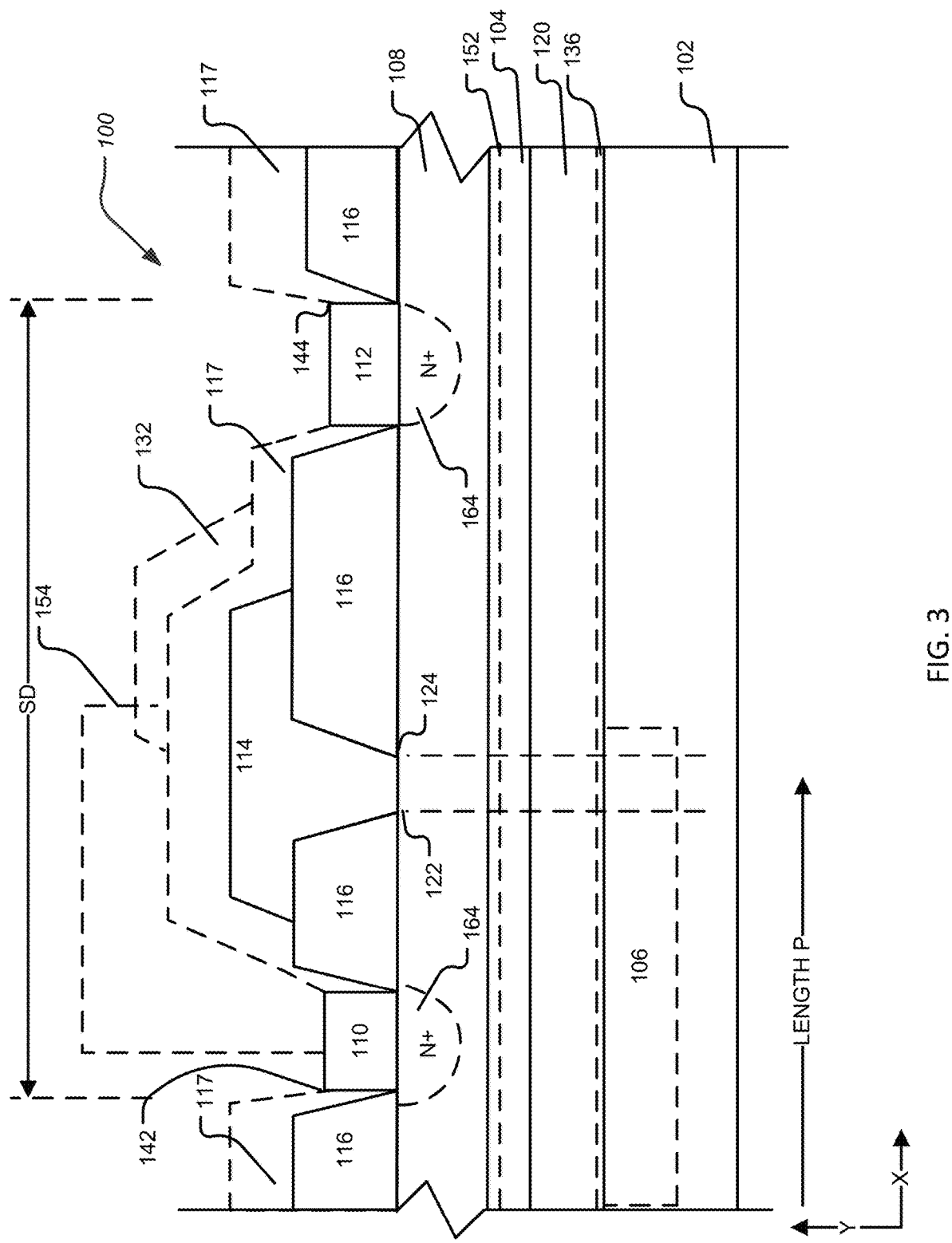
FIG. 3 shows a cross-sectional view of an aspect of the transistor according to FIG. 1.

FIG. 3 shows a cross-sectional view of an aspect of the transistor according to FIG. 1.

In one aspect, the p-type material layer 106 may not extend over the entire area of the substrate layer 102 as shown by the arrow LENGTH P as shown in FIG. 3. In this regard, the p-type material layer 106 may be selectively arranged as described in detail below, the p-type material layer 106 may be arranged over the entire length and selectively removed as described in detail below, the p-type material layer 106 may be arranged over the entire length and selectively electrically neutralized as described in detail below, or the like. Accordingly, the specific constructions of the p-type material layer 106 described below encompass any of these configurations that result in the p-type material layer 106 having an operating construction and arrangement as noted below. In other words, the length and/or size of the p-type material layer 106 does not include a part that is partially electrically neutralized or partially etched. The length and/or size of the p-type material layer 106 may depend on the application of the transistor 100, requirements for the transistor 100, and the like.

With reference to the aspects further described below, the p-type material layer 106 may extend horizontally along the X axis parallel to the arrow LENGTH P. Moreover, the p-type material layer 106 may extend horizontally parallel to the arrow LENGTH P to a point defined by a line that is perpendicular (parallel to the y-axis) to the arrow LENGTH P and extends through a component of the transistor 100 as illustrated.

In one aspect, of the disclosure, the p-type material layer 106 may extend laterally from at least beneath the source 110 to a position beneath a first edge 124 of the gate 114. In particular, the first edge 124 may be an edge of the gate 114 on a side of the gate 114 adjacent the drain 112 and which may also be a lowest surface of the gate 114.

In certain aspects of the disclosure, the p-type material layer 106 may extend to a point within about 0 to about 0.7 µm of a first edge 124 of the gate 114. In certain aspects of the disclosure, the p-type material layer 106 may extend to a point within about 0 to about 0.5 µm of the first edge 124 of the gate 114. In certain aspects of the disclosure, the p-type material layer 106 may extend to a point within about 0 to about 0.3 µm of the first edge 124 of the gate 114.

In one aspect, of the disclosure, the p-type material layer 106 may extend laterally from at least beneath the source 110 to a position beneath a second edge 122 of the gate 114. In particular, the second edge 122 may be an edge of the gate 114 on a side of the gate 114 adjacent the source 110 and which may also be a lowest surface of the gate 114.

In certain aspects of the disclosure, the p-type material layer 106 may extend to a point within about 0 to about 0.7 µm of the second edge 122 of the gate 114. In certain aspects of the disclosure, the p-type material layer 106 may extend to a point within about 0 to about 0.5 µm of the second edge 122 of the gate 114. In certain aspects of the disclosure, the p-type material layer 106 may extend to a point within about 0 to about 0.3 µm of the second edge 122 of the gate 114.

In other aspects, a length of the p-type material layer 106 LENGTH P can also be seen in relation to positions and/or lengths of other components based on the length SD as illustrated in FIG. 3. The length SD in this case may be the length between an edge 142 of the source 110 toward an edge 144 of the drain 112 as shown in FIG. 3. In particular, the edge 142 may be defined as an edge or surface on the source 110 that is parallel to the Y axis on a side of the source 110 opposite to the gate 114; and, the edge 144 may be defined as an edge or surface on the drain 112 that is parallel to the Y axis on a side of the drain 112 opposite to the gate 114.

In one aspect, the length of the p-type material layer 106 may extend from 10% to 20% of the length of SD, meaning the p-type material layer 106 may extend 10% to 20% past the edge 142 of the source 110 toward the drain 112. In one aspect, the length of the p-type material layer 106 may extend from 20% to 30% of the length of SD, meaning the p-type material layer 106 may extend 20% to 30% past the edge 142 of the source 110 toward the drain 112. In one aspect, the length of the p-type material layer 106 may extend from 30% to 40% of the length of SD, meaning the p-type material layer 106 may extend 30% to 40% past the edge 142 of the source 110 toward the drain 112. In one aspect, the length of the p-type material layer 106 may extend from 40% to 50% of the length of SD, meaning the p-type material layer 106 may extend 40% to 50% past the edge 142 of the source 110 toward the drain 112. In one aspect, the length of the p-type material layer 106 may extend from 50% to 60% of the length of SD, meaning the p-type material layer 106 may extend 50% to 60% past the edge 142 of the source 110 toward the drain 112. In one aspect, the length of the p-type material layer 106 may extend from 60% to 70% of the length of SD, meaning the p-type material layer 106 may extend 60% to 70% past the edge 142 of the source 110 toward the drain 112. In one aspect, the length of the p-type material layer 106 may extend from 70% to 80% of the length of SD, meaning the p-type material layer 106 may extend 70% to 80% past the edge 142 of the source 110 toward the drain 112.

Figure 4:
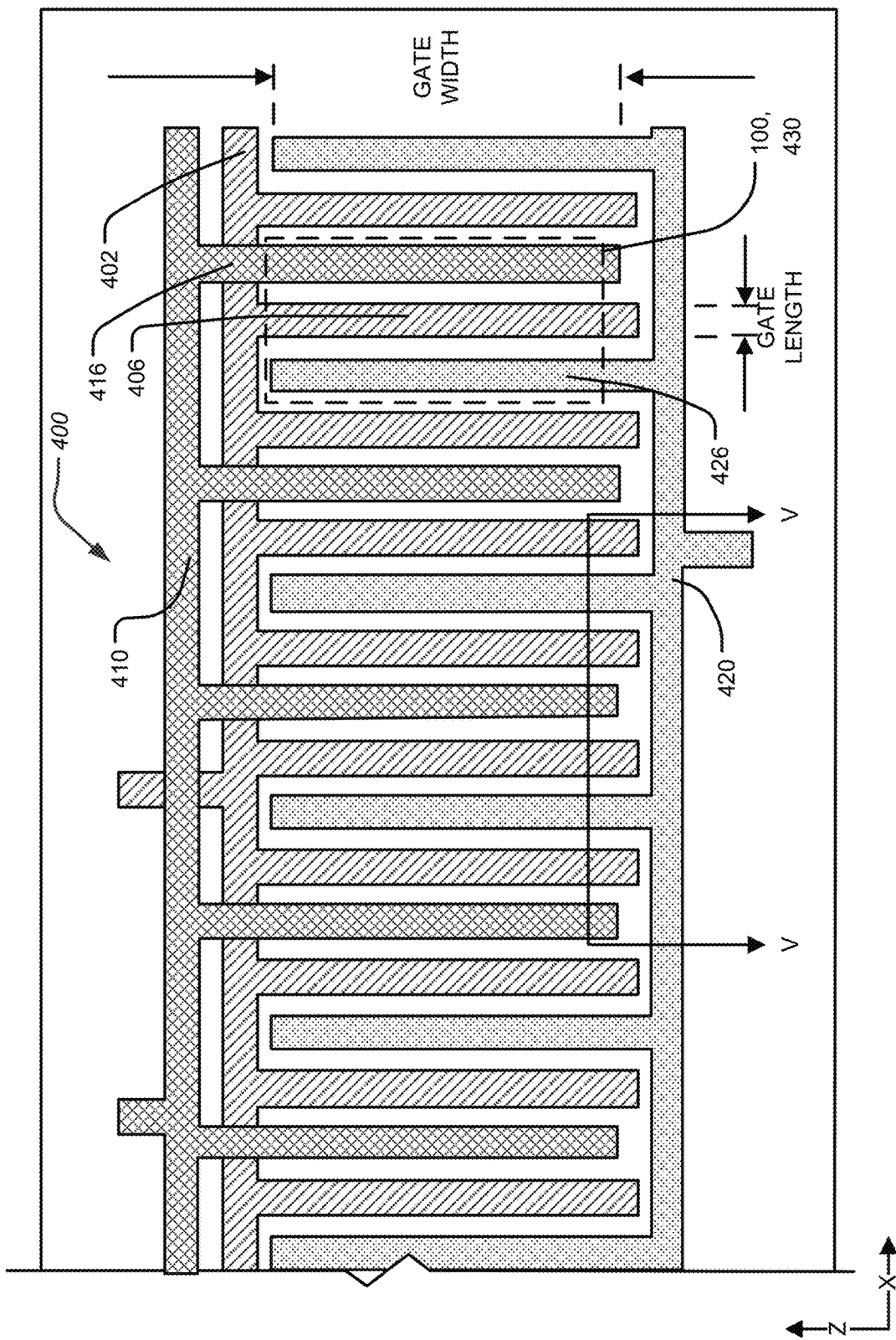
FIG. 4 illustrates a semiconductor device that may include a plurality of unit cell transistors in accordance with an aspect of the disclosure.

FIG. 4 illustrates a semiconductor device that may include a plurality of unit cell transistors in accordance with an aspect of the disclosure.

As shown in FIG. 4, aspects of the disclosure may include a semiconductor device 400 that may include a plurality of the transistor 100. In particular, the transistor 100 may be one of a plurality of unit cells 430 implemented in the semiconductor device 400.

In particular, FIG. 4 illustrates a transistor 100 that may include any one or more aspects of the disclosure described herein. In particular, the transistor 100 of FIG. 4 may include the p-type material layer 106 as described above. In this regard, the transistor 100 of FIG. 4 implements a length of the p-type material layer 106 as described herein that reduces drain lag effect; and the transistor 100 of FIG. 4 implements the back barrier layer 120 as described herein that reduces gate lag effect.

The semiconductor device 400 may include a gate bus 402 that may be connected to a plurality of gate fingers 406 that may extend in parallel in a first direction (e.g., the Z-direction indicated in FIG. 4) that connect to or form part of the gate 114. A source bus 410 may be connected to a plurality of parallel ones of source contacts 416 that connect to or form part of the source 110. In some aspects, the source bus 410 may be connected to a ground voltage node on an underside of the semiconductor device 400. A drain bus 420 may be connected to a plurality of drain contacts 426 that connect to or form part of the drain 112.

As can be seen in FIG. 4, each gate finger 406 may run along the Z-direction between a pair of adjacent ones of the source contact 416 and the drain contact 426. The semiconductor device 400 may include a plurality of unit cells 430, where each one of the plurality of unit cells 430 includes an implementation of the transistor 100. One of the plurality of unit cells 430 is illustrated by the dashed Box in FIG. 4, and includes a gate finger 406 that extends between adjacent ones of the source contact 416 and the drain contact 426.

The "gate width" refers to the distance by which the gate finger 406 overlaps with its associated one of the source contact 416 and drain contact 426 in the Z-direction. That is, "width" of a gate finger 406 refers to the dimension of the gate finger 406 that extends in parallel to and adjacent an implementation of the source contact 416 and the drain contact 426 (the distance along the Z-direction). Each of the plurality of unit cells 430 may share one of the source contact 416 and/or the drain contact 426 with one or more adjacent ones of the plurality of unit cells 430. Although a particular number of the of the plurality of unit cells 430 is illustrated in FIG. 4, it will be appreciated that the semiconductor device 400 may include more or less of the plurality of unit cells 430.

Figure 5:
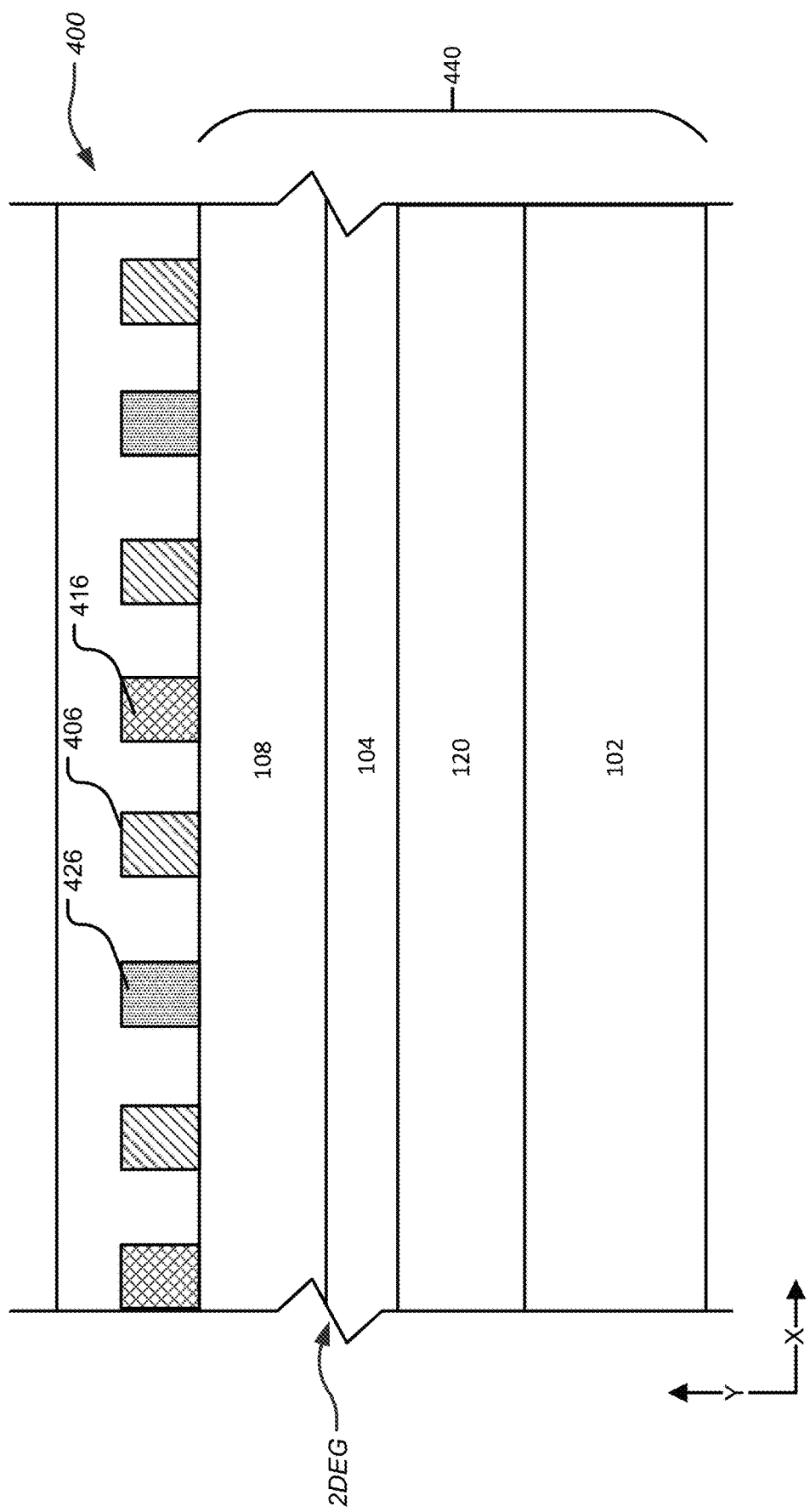
FIG. 5 is a schematic cross-sectional view taken along line V-V of FIG. 4.

FIG. 5 is a schematic cross-sectional view taken along line V-V of FIG. 4.

Referring to FIG. 5, the semiconductor device 400 may include a semiconductor structure 440 that includes the substrate layer 102, the back barrier layer 120, the channel layer 104, the barrier layer 108, and/or the like as described herein. The source contact 416 and the drain contact 426 may be on the barrier layer 108 as described herein. The gate fingers 406 may be on the substrate layer 102 between the source contacts 416 and the drain contacts 426 as described herein. While the gate fingers 406, the source contact 416, and the drain contacts 426 are all shown schematically in FIG. 4 and FIG. 5 as having a similar "dimension," it will be appreciated that each may have different shapes and dimensions consistent with the disclosure.

Figure 6:
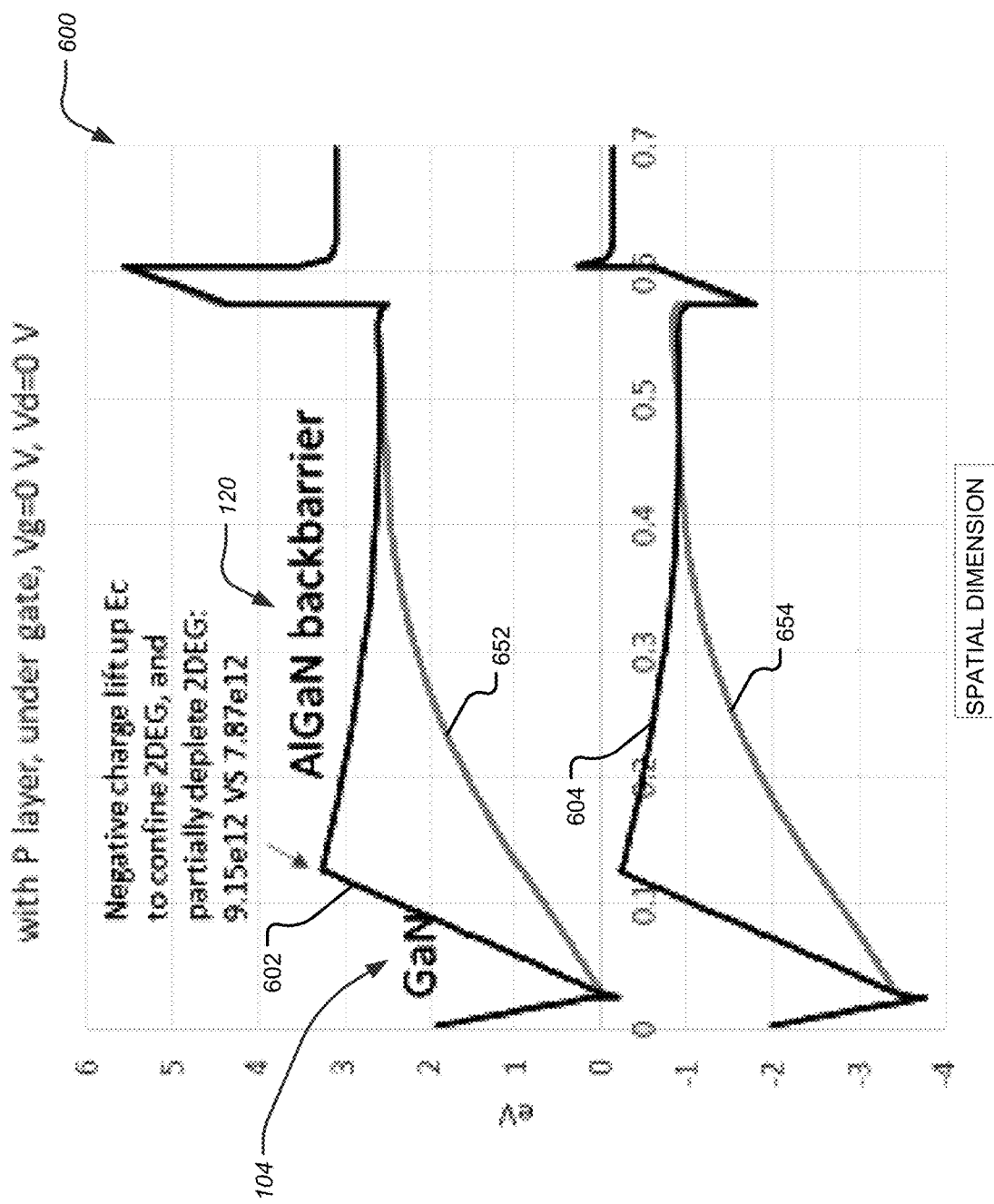
FIG. 6 illustrates a band diagram of the disclosed transistor in comparison to a typical transistor at certain operating values.

FIG. 6 illustrates a band diagram of the disclosed transistor in comparison to a typical transistor at certain operating values.

In particular, FIG. 6 illustrates a band diagram 600 of the transistor 100 of the disclosure and a HEMT transistor implemented without the back barrier layer 120 plotting various key electron energy levels as a function of a spatial dimension with a zero gate voltage and a zero drain voltage. The vertical axis of the band diagram represents the energy of an electron; and the horizontal axis relates to a spatial dimension of the two different transistors.

More specifically, the band diagram 600 includes an Ec curve 602 implementing the transistor 100 as disclosed herein with the back barrier layer 120 and the p-type material layer 106 arranged under the gate; and the band diagram 600 includes an Ec curve 652 implementing a HEMT transistor implemented without the back barrier layer 120.

Additionally, the band diagram 600 includes an Ev curve 604 implementing the transistor 100 as disclosed herein with the back barrier layer 120 and the p-type material layer 106 arranged under the gate; and the band diagram 600 includes an Ev curve 654 implementing a HEMT transistor implemented without the back barrier layer 120.

With reference to FIG. 6, it should be noted that the Ec curve 602 illustrates a negative charge lift up of the Ec curve 602 of the transistor 100 of the disclosure between the location of the channel layer 104 and the back barrier layer 120. In particular, the Ec curve 602 illustrates a negative charge lift up to confine the 2DEG and partially deplete the 2DEG. It should be further noted that the Ec curve 652 implementing a HEMT transistor implemented without the back barrier layer 120 includes minimal a negative charge lift up.

With further reference to FIG. 6, it should be noted that the Ev curve 604 illustrates a negative charge lift up of the Ev curve 604 of the transistor 100 of the disclosure between the location of the channel layer 104 and the back barrier layer 120. It should be further noted that the Ev curve 654 implementing a HEMT transistor implemented without the back barrier layer 120 includes minimal negative charge lift up.

Figure 7:
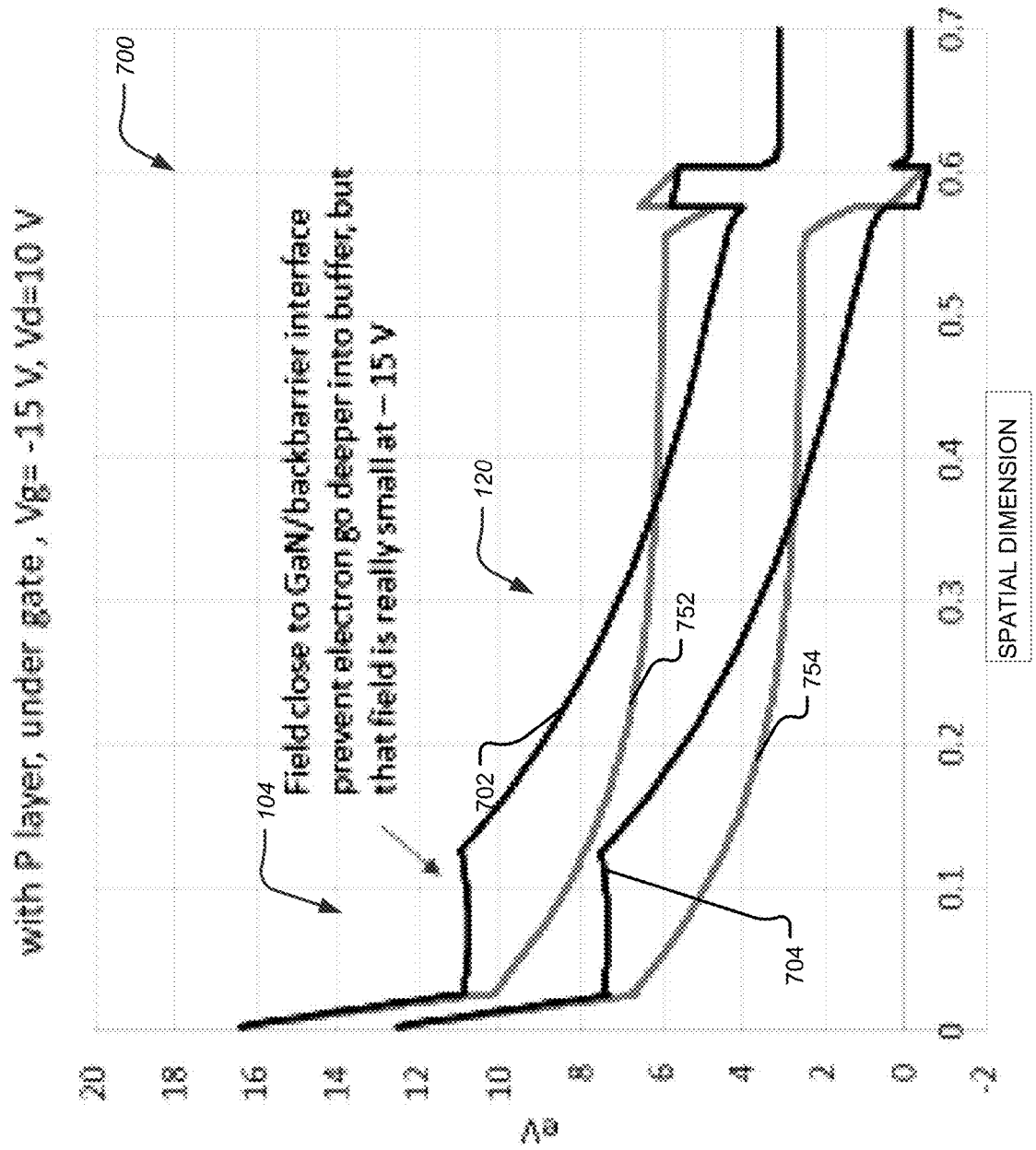
FIG. 7 illustrates a band diagram of the disclosed transistor in comparison to a typical transistor at certain operating values.

FIG. 7 illustrates a band diagram of the disclosed transistor in comparison to a typical transistor at certain operating values.

In particular, FIG. 7 illustrates a band diagram 700 of the transistor 100 of the disclosure and a HEMT transistor implemented without the back barrier layer 120 plotting various key electron energy levels as a function of a spatial dimension with a −15V gate voltage and a 10V drain voltage. The vertical axis of the band diagram represents the energy of an electron; and the horizontal axis relates to a spatial dimension of the two different transistors.

More specifically, the band diagram 700 includes an Ec curve 702 implementing the transistor 100 as disclosed herein with the back barrier layer 120 and the p-type material layer 106 arranged under the gate; and the band diagram 700 includes an Ec curve 752 implementing a HEMT transistor implemented without the back barrier layer 120.

Additionally, the band diagram 700 includes an Ev curve 704 implementing the transistor 100 as disclosed herein with the back barrier layer 120 and the p-type material layer 106 arranged under the gate; and the band diagram 700 includes an Ev curve 754 implementing a HEMT transistor implemented without the back barrier layer 120.

With reference to FIG. 7, it should be noted that the Ec curve 702 illustrates a field close to an interface between the channel layer 104 and the back barrier layer 120 preventing electrons from going deeper into the back barrier layer 120 of the transistor 100. It should be further noted that the Ec curve 752 implementing a HEMT transistor implemented without the back barrier layer 120 does not include such a field. Likewise, it should be noted that the Ev curve 704 illustrates a field close to an interface between the channel layer 104 and the back barrier layer 120 preventing electrons from going deeper into the back barrier layer 120 of the transistor 100; and the Ev curve 754 implementing a HEMT transistor implemented without the back barrier layer 120 does not include such a field.

Additionally, in a transistor with a conventional buffer, the bands such as the Ec curve 752 on the Ev curve 754 bend downwards at large negative voltages. This allows electrons to flow down deep into the buffer and get trapped. With the disclosed implementation of the transistor 100 with the p-type material layer 106 and the back barrier layer 120, there is a flat or slightly upward band of the Ec curve 702 and the Ev curve 704 bending near the channel layer 104. This prevents electron injection and trapping in the buffer of the transistor 100.

FIG. 8 shows a cross-sectional view of another aspect of a transistor according to the disclosure.

The transistor 100 of FIG. 8 may be structured consistent with the transistor of FIG. 1, the transistor of FIG. 2, and/or the transistor of FIG. 3 and may include any one or more aspects as described herein. In particular, the transistor 100 of FIG. 8 in conjunction with the p-type material layer 106 and the back barrier layer 120 as disclosed, associated structures thereof, and/or associated processes thereof, may provide a systematic approach to reducing lag. More specifically, the transistor 100 of the disclosure may implement the p-type material layer 106 and/or processes thereof as a drain lag reduction structure and/or process to reduce the drain lag effect in the transistor 100 and the transistor 100 of the disclosure may implement the back barrier layer 120 and/or processes thereof as a gate lag reduction structure and/or process to reduce the gate lag effect in the transistor 100.

FIG. 8 further illustrates implementation of the second spacer layer 117. The second spacer layer 117 may be provided under the gate 114 and/or over the spacer layer 116. The second spacer layer 117 may be a passivation layer made of SiN, AlO, SiO, $SiO_2$, AlN, or the like, or a combination incorporating multiple layers thereof.

In one aspect, the second spacer layer 117 is a passivation layer made of SiN. In one aspect, the second spacer layer 117 can be deposited using MOCVD, plasma chemical vapor deposition (CVD), hot-filament CVD, or sputtering. In one aspect, the second spacer layer 117 may include deposition of $Si_3N_4$. In one aspect, the second spacer layer 117 forms an insulating layer. In one aspect, the second spacer layer 117 forms an insulator. In one aspect, the second spacer layer 117 may be a dielectric. In one aspect, a second spacer layer 117 may be provided on the spacer layer 116. In one aspect, the second spacer layer 117 may include non-conducting material such as a dielectric. In one aspect, the second spacer layer 117 may include a number of different layers of dielectrics or a combination of dielectric layers. In one aspect, the second spacer layer 117 may be many different thicknesses, with a suitable range of thicknesses being approximately 0.05 to 2 microns. In one aspect, the second spacer layer 117 may include a material such as a Group III nitride material having different Group III elements such as alloys of Al, Ga, or In, with a suitable spacer layer material being $Al_xIn_yGa_{1-x-y}$ (where $0<=x<=1$ and $0<=y<=1$, $x+y<=1$).

Figure 9:
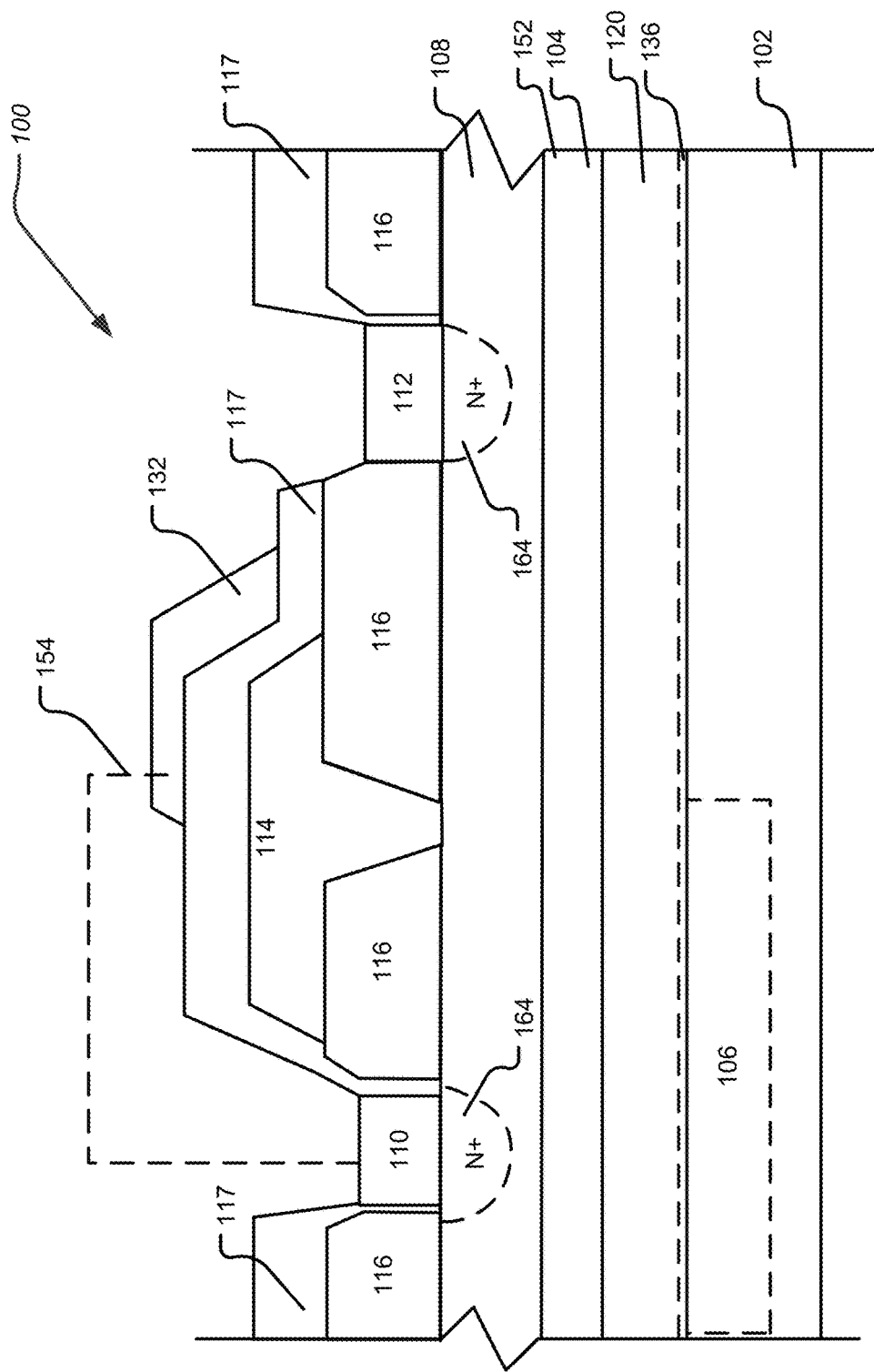
FIG. 9 shows a cross-sectional view of another aspect of a transistor according to the disclosure.

FIG. 9 shows a cross-sectional view of another aspect of a transistor according to the disclosure.

The transistor 100 of FIG. 9 may be structured consistent with the transistor of FIG. 1, the transistor of FIG. 2, and/or the transistor of FIG. 3 and may include any one or more aspects as described herein. In particular, the transistor 100 of FIG. 9 in conjunction with the p-type material layer 106 and the back barrier layer 120 as disclosed, associated structures thereof, and/or associated processes thereof, may provide a systematic approach to reducing lag. More specifically, the transistor 100 of the disclosure may implement the p-type material layer 106 and/or processes thereof as a drain lag reduction structure and/or process to reduce the drain lag effect in the transistor 100 and the transistor 100 of the disclosure may implement the back barrier layer 120 and/or processes thereof as a gate lag reduction structure and/or process to reduce the gate lag effect in the transistor 100.

FIG. 9 further illustrates implementation of the field plate 132. In one aspect, the field plate 132 may be arranged on the second spacer layer 117 between the gate 114 and drain 112. In one aspect, the field plate 132 may be deposited on the second spacer layer 117 between the gate 114 and the drain 112. In one aspect, the field plate 132 may be electrically connected to one or more other components in the transistor 100. In one aspect, the field plate 132 may not be electrically connected to any other components of the transistor 100. In some aspects, the field plate 132 may be adjacent the gate 114 and a second spacer layer 117 of dielectric material may be included at least partially over the gate 114 to isolate the gate 114 from the field plate 132. In some aspects, the field plate 132 may overlap the gate 114 and a second spacer layer 117 of dielectric material may be included at least partially over the gate 114 to isolate the gate 114 from the field plate 132.

The field plate 132 may extend different distances from the edge of the gate 114, with a suitable range of distances being approximately 0.1 to 2 microns. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the field plate 132 may be formed on the second spacer layer 117 between the gate 114 and the drain 112, with the field plate 132 being in proximity to the gate 114 but not overlapping the gate 114. In one aspect, a space between the gate 114 and field plate 132 may be wide enough to isolate the gate 114 from the field plate 132, while being small enough to maximize a field effect provided by the field plate 132.

In certain aspects, the field plate 132 may reduce a peak operating electric field in the transistor 100. In certain aspects, the field plate 132 may reduce the peak operating electric field in the transistor 100 and may increase the breakdown voltage of the transistor 100. In certain aspects, the field plate 132 may reduce the peak operating electric field in the transistor 100 and may reduce trapping in the transistor 100. In certain aspects, the field plate 132 may reduce the peak operating electric field in the transistor 100 and may reduce leakage currents in the transistor 100.

In other aspects, for example, the spacer layer 116 is formed on the barrier layer 108 and on the gate 114. In such aspects, the field plate 132 can be formed directly on the spacer layer 116. Other multiple field plate configurations are possible with the field plate 132 overlapping or non-overlapping with the gate 114 and/or multiple field plates 132 being used.

Figure 10:
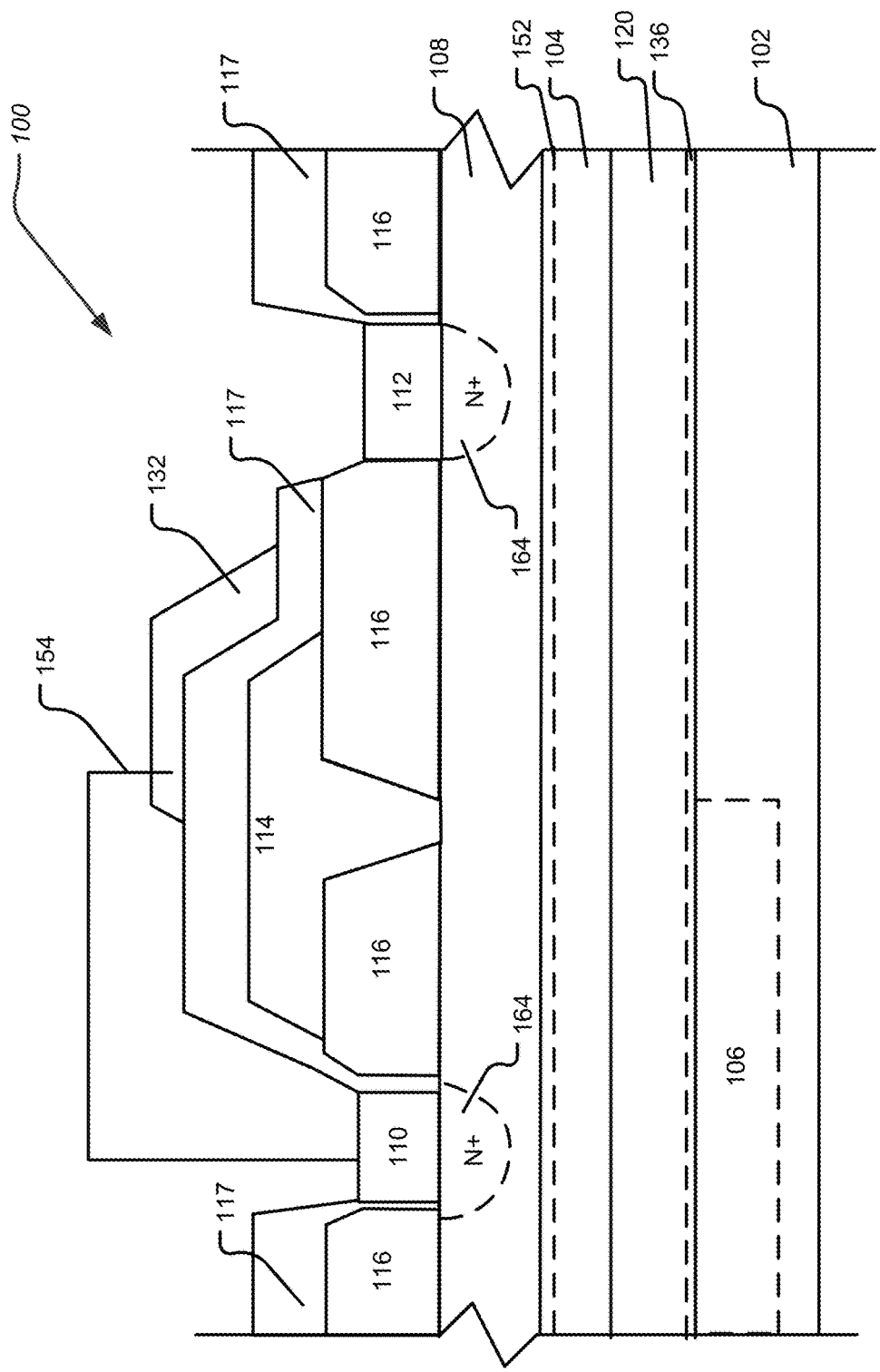
FIG. 10 shows a cross-sectional view of another aspect of a transistor according to the disclosure.

FIG. 10 shows a cross-sectional view of another aspect of a transistor according to the disclosure.

The transistor 100 of FIG. 10 may be structured consistent with the transistor of FIG. 1, the transistor of FIG. 2, and/or the transistor of FIG. 3 and may include any one or more aspects as described herein. In particular, the transistor 100 of FIG. 10 in conjunction with the p-type material layer 106 and the back barrier layer 120 as disclosed, associated structures thereof, and/or associated processes thereof, may provide a systematic approach to reducing lag. More specifically, the transistor 100 of the disclosure may implement the p-type material layer 106 and/or processes thereof as a drain lag reduction structure and/or process to reduce the drain lag effect in the transistor 100 and the transistor 100 of the disclosure may implement the back barrier layer 120 and/or processes thereof as a gate lag reduction structure and/or process to reduce the gate lag effect in the transistor 100.

In one aspect as illustrated in FIG. 10, the connection 154 may be formed on the spacer layer 116 and/or the second spacer layer 117 to extend between the source 110 and the field plate 132. In some aspects, the connection 154 may include a conductive material, many different conductive materials, a suitable material being a metal, or combinations of metals, deposited using standard metallization methods. In one aspect, the materials may include one or more of titanium, gold, nickel, or the like.

In particular, the transistor 100 of FIG. 10 illustrates the field plate 132 connected to the source 110 through the connection 154 (source—field plate interconnect). Additionally or alternatively, the field plate 132 may be connected to the gate 114 through a connection (gate—field plate interconnect (not shown)). In one aspect, the connection 154 may be formed on the spacer layer 116 and/or the second spacer layer 117 to extend between the field plate 132 and the source 110. In one aspect, the connection 154 may be formed with the field plate 132 during the same manufacturing step. In one aspect, a plurality of the connection 154 and/or a plurality of gate—field plate interconnect may be used. In one aspect, a plurality of the field plates 132 may be used. In one aspect, a plurality of the field plates 132 may be used and each of the plurality of field plates 132 may be stacked with a dielectric material therebetween. In some aspects, the connection 154 and/or a plurality of gate—field plate interconnect may include a conductive material, many different conductive materials, a suitable material being a metal, or combinations of metals, deposited using standard metallization methods. In one aspect, the materials may include one or more of titanium, gold, nickel, or the like.

In one aspect, the gate—field plate interconnect may be formed on the spacer layer 116 and/or the second spacer layer 117 to extend between the gate 114 and the field plate 132. In some aspects, the gate—field plate interconnect may include a conductive material, many different conductive materials, a suitable material being a metal, or combinations of metals, deposited using standard metallization methods. In one aspect, the materials may include one or more of titanium, gold, nickel, or the like.

In one aspect of the transistor 100 described herein, the gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three-layer structure. Such a structure may have advantages because of the high adhesion of some materials. In one aspect, the gate 114 may further include an overlayer of highly conductive metal. In one aspect, the gate 114 may be configured as a T-shaped gate.

In one aspect of the transistor 100 described herein, one or more metal overlayers may be provided on one or more of the source 110, the drain 112, and the gate 114. The overlayers may be Au, Silver (Ag), Al, Pt, Ti, Si, Ni, Al, and/or Copper (Cu). Other suitable highly conductive metals may also be used for the overlayers. In another aspect, the source 110, the drain 112, and the gate 114 may include Au, Silver (Ag), Al, Pt, Ti, Si, Ni, Al, and/or Copper (Cu). Other suitable highly conductive metals may also be used.

In one aspect of the transistor 100 described herein, a second channel layer may be deposited or grown on a first implementation of the channel layer 104 on a side of the first implementation of the channel layer 104 opposite of the substrate layer 102. In one aspect, the second channel layer may be formed directly on the first implementation of the channel layer 104. In one aspect, the second channel layer may be a high-purity material such as Gallium Nitride (GaN), AlN, or the like. In one aspect, the second channel layer may be a high-purity GaN. In one aspect, the second channel layer may be a high-purity AlN. The second channel layer may be a p-type material or n-type material. In another aspect, the second channel layer may be undoped.

In aspects of the transistor 100 of the disclosure, the contacts of the source 110, the gate 114, and/or the drain 112 may include Al, Ti, Si, Ni, and/or Pt. In this aspect, utilizing the same material may be beneficial in that manufacturing may be easier, simplified, and/or less costly. In other aspects, the material of the contacts of the source 110, the gate 114, and the drain 112 may be different.

Figure 11:
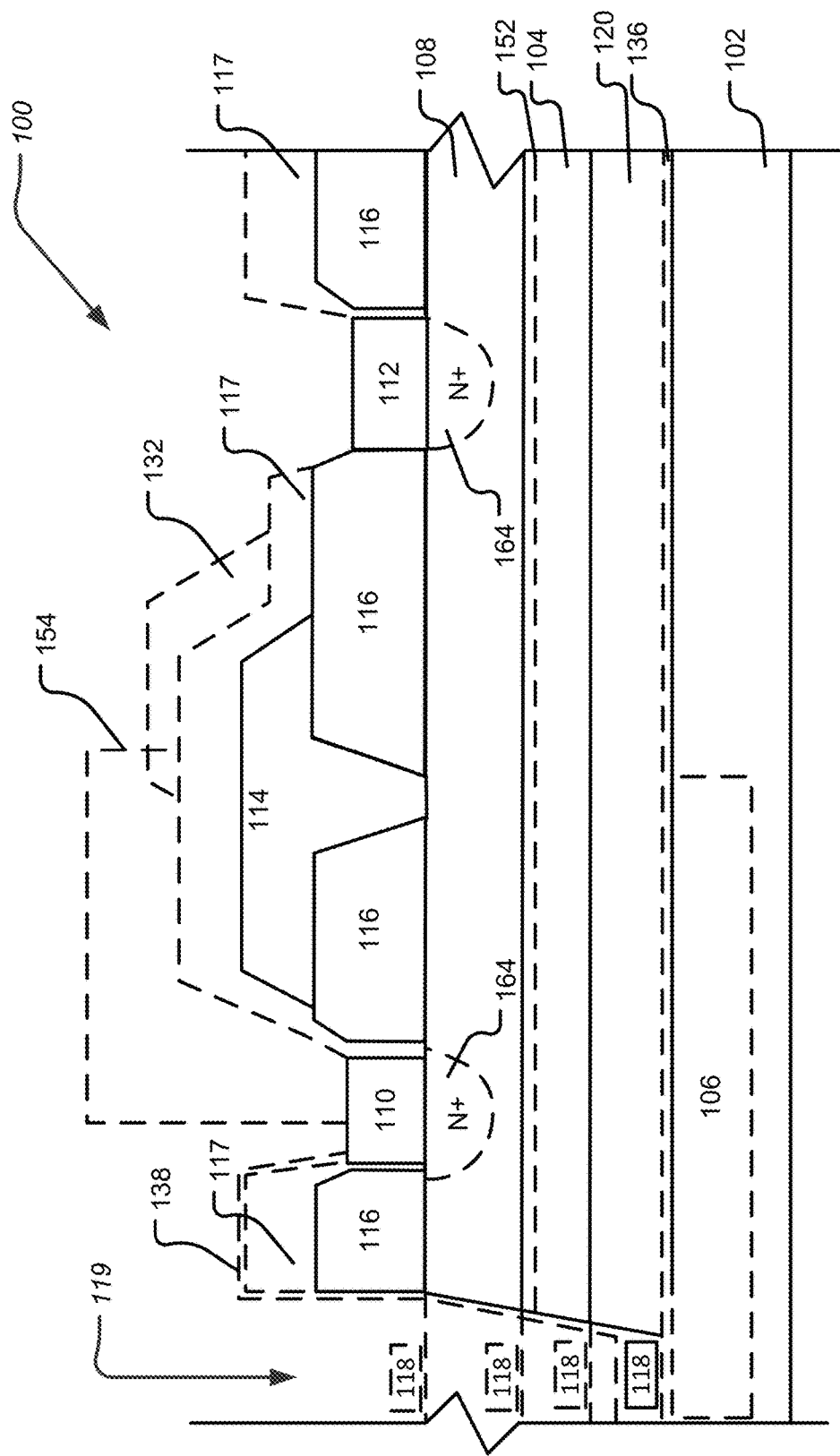
FIG. 11 shows a cross-sectional view of another aspect of a transistor according to the disclosure.

FIG. 11 shows a cross-sectional view of another aspect of a transistor according to the disclosure.

The transistor 100 of FIG. 11 may be structured consistent with the transistor of FIG. 1, the transistor of FIG. 2, and/or the transistor of FIG. 3 and may include any one or more aspects as described herein. In particular, the transistor 100 of FIG. 11 in conjunction with the p-type material layer 106 and the back barrier layer 120 as disclosed, associated structures thereof, and/or associated processes thereof, may provide a systematic approach to reducing lag. More specifically, the transistor 100 of the disclosure may implement the p-type material layer 106 and/or processes thereof as a drain lag reduction structure and/or process to reduce the drain lag effect in the transistor 100 and the transistor 100 of the disclosure may implement the back barrier layer 120 and/or processes thereof as a gate lag reduction structure and/or process to reduce the gate lag effect in the transistor 100.

In various aspects of the disclosure, the p-type material layer 106 of the transistor 100 may be buried within the substrate layer 102 and otherwise may not be electrically connected to any portion of the transistor 100. In one aspect as illustrated in FIG. 11, the transistor 100 may include a p-type material contact 118 that may be electrically connected to receive an external signal, bias, and/or the like. The p-type material contact 118 may be electrically connected and arranged in the substrate layer 102, the p-type material layer 106, the substrate layer 102, the channel layer 104, the barrier layer 108, and/or the like. The p-type material contact 118 may be formed in a recess 119 in the substrate layer 102, the p-type material layer 106, the substrate layer 102, the channel layer 104, the barrier layer 108, and/or the like. The recess 119 may extend down to the p-type material layer 106 to allow for the p-type material contact 118 to be created there. The recess 119 may be formed by etching, and may also use a material to define the recess 119. The material may be removed after the recess 119 has been created.

In particular, the recess 119 may remove any material above the p-type material layer 106 within a portion of a region associated with the source 110, exposing the p-type material layer 106 on a side opposite of the substrate layer 102. In another aspect of the disclosure, to create a place for the p-type material contact 118, a recess 119 may be created by removing at least part of the substrate layer 102, the p-type material layer 106, the substrate layer 102, the channel layer 104, the barrier layer 108, and/or the like.

In certain embodiments, the source 110 may be electrically connected to the p-type material contact 118 through a connection 138. In certain embodiments, the field plate 132 may be electrically connected to the source 110 through the connection 154. In certain embodiments, the field plate 132 may be connected to the source 110, and the source 110 may be connected to the p-type material contact 118 through the connection 138.

In certain embodiments, the gate 114 may be electrically connected to the p-type material contact 118 through a connection (not shown). In certain embodiments, the field plate 132 may be electrically connected to the gate 114 through the connection. In certain embodiments, the field plate 132 may be connected to the gate 114, and the gate 114 may be connected to the p-type material contact 118 through the connection.

FIG. 11 is meant to broadly describe different embodiments of the present invention (e.g., different p-layer and/or field plate configurations), but in the interest of clarity, not all embodiments are expressly depicted. It should be understood that the back barrier layer 120 structures of the present invention can be utilized with a variety of p-type material layer 106 structures as described herein and otherwise. In certain embodiments, the p-type material layer 106 structure may be electrically connected to a separate bias voltage/control signal, electrically connected to the source 110 or electrically connected to the gate 114 or not electrically connected to the source 110, the gate 114, and the separate bias/control signal. Such electrical connection can be through a via in the epitaxial material and/or an electrical connection outside and/or at an edge of the epitaxial material. For example, the via may be structured within the recess 119. The p-type material layer 106 can be formed or structured in any of the different variations described herein or otherwise. Depending on the embodiment, various field plate 132 configurations are possible. For example, field plates 132 may be integral with the gate 114, single or multiple field plates 132 are possible with or without intervening dielectric spacer layers between the field plates 132. A field plate 132 can vertically overlap or not vertically overlap with the gate 114 or an underlying field plate 132. The field plates 132 may be electrically connected to the gate 114 or the source 110 or one or more field plates 132 connected to the gate 114, one or more filed plates 132 connected to the source 110, and/or one or more field plates 132 connected to neither the source 110 nor the gate 114.

Figure 12:
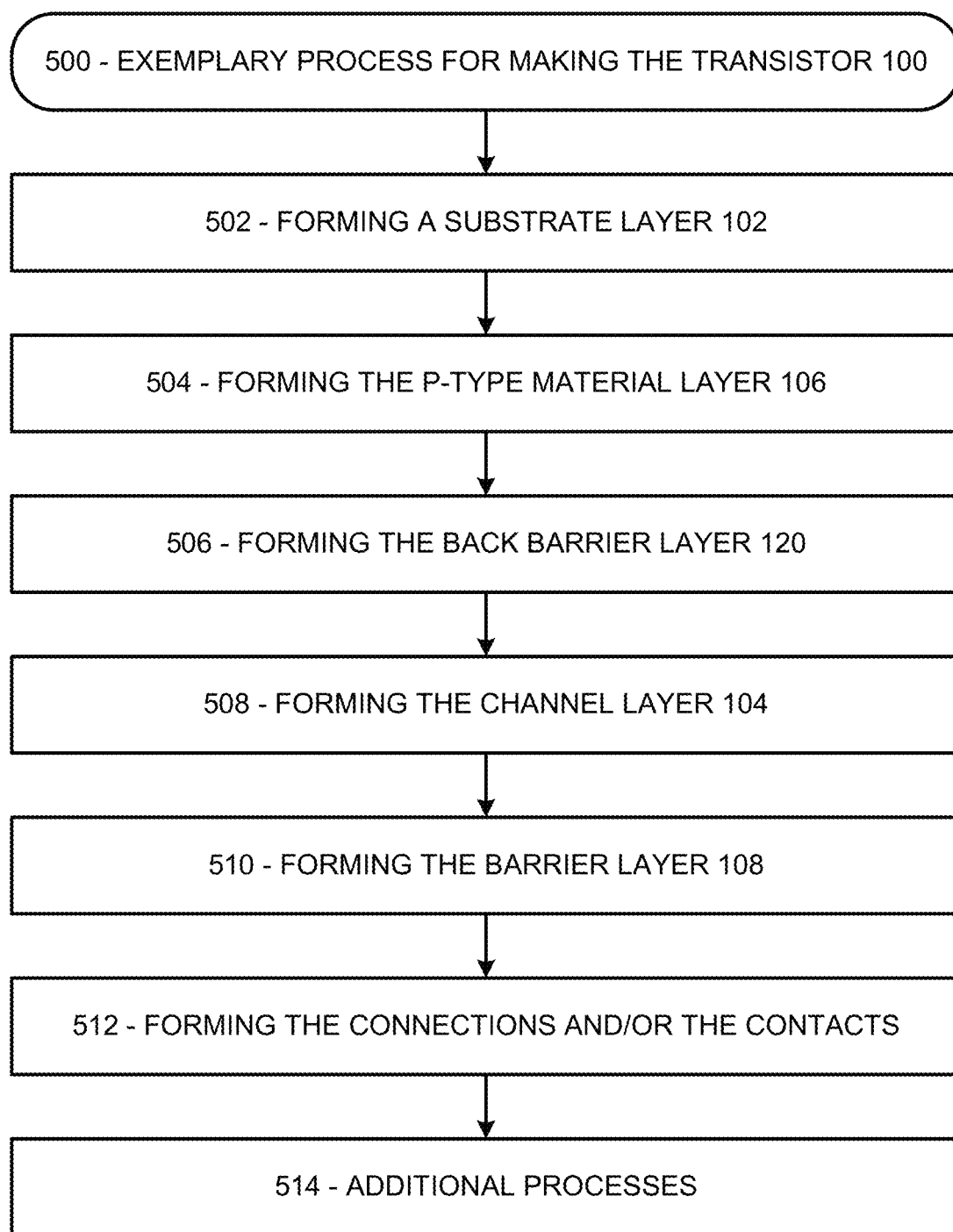
FIG. 12 shows a process for making a transistor according to the disclosure.

FIG. 12 shows a process for making a transistor according to the disclosure.

In particular, FIG. 12 shows an exemplary process 500 for making the transistor 100 of the disclosure. It should be noted that the process 500 is merely exemplary and may be modified consistent with the various aspects disclosed herein. In particular, the process 500 may include any one or more aspects of the disclosure described herein.

In particular, the process 500 may include making the p-type material layer 106 and the back barrier layer 120 as described above. In this regard, the process 500 implements the p-type material layer 106 and the back barrier layer 120 as disclosed, associated structures thereof, and/or associated processes thereof, that may provide a systematic approach to reducing lag. More specifically, the process 500 may implement the p-type material layer 106 thereof as a drain lag reduction structure and/or process to reduce the drain lag effect in the transistor 100 and the process 500 of the disclosure may implement the back barrier layer 120 as a gate lag reduction structure and/or process to reduce the gate lag effect in the transistor 100.

The process 500 may begin at step 502 by forming a substrate layer 102. The substrate layer 102 may be formed consistent with the disclosure. For example, the substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

The process 500 may include a step 504 of forming the p-type material layer 106. The p-type material layer 106 may be formed as described in the disclosure. This may include implanting Al into the substrate layer 102 to form the p-type material layer 106 in the substrate layer 102. For example, the p-type material layer 106 may be formed by ion implantation of Al and annealing. In one aspect, the p-type material layer 106 may be formed by implantation and annealing of Al prior to the growth of any GaN layers. In one aspect, the ion implementation may utilize channeling implants. In one aspect, the channeling implants may include aligning the ion beam to the substrate layer 102. Alignment of the ion beam may result in increased implantation efficiency. In some aspects, the process 500 may further include implanting Al into the substrate layer 102 to form the p-type material layer 106 in the substrate layer 102. Thereafter, the substrate layer 102 may be annealed as defined herein. In one aspect, the p-type material layer 106 may be formed by ion implantation of $^{27}$Al in 4H—SiC implanted with channeling conditions with an implant energy of $E_1$=100 keV with a dose of 1E13 cm$^2$ at 25° C. In one aspect, the p-type material layer 106 may be formed by ion implantation of $^{27}$Al in 4H—SiC implanted with channeling conditions with an implant energy of $E_2$=300 keV with a dose of 1E13 cm$^2$ at 25° C. However, other implant energies and doses are contemplated as well.

The process 500 may include a step 506 of forming the back barrier layer 120 on the substrate layer 102 and/or on the nucleation layer 136. The back barrier layer 120 may be grown or deposited on the substrate layer 102 and/or on the nucleation layer 136 as described in the disclosure. In one aspect, a nucleation layer 136 may be formed on the substrate layer 102 and the back barrier layer 120 may be formed at step 506 on the nucleation layer 136.

The step 506 of forming the back barrier layer 120 may include forming the back barrier layer 120 so as to limit and/or avoid impurities such as silicon, oxygen, carbon, and/or the like to reduce gate lag. In particular, that impurities provide trapping, leaking, and/or the like. More specifically, aspects of the disclosure may implement the back barrier layer 120 with low background impurity levels. In one aspect, the disclosure may implement AlGaN for the back barrier layer 120 with low background impurity levels. In this regard, impurities have been found to build complexes with dislocations, such as point defects, which also act as deep trap levels. The step 506 of forming the back barrier layer 120 may be configured to provide a sharp interface to the channel layer 104. This interface may function as a barrier for electrons. In aspects of the transistor 100 of the disclosure, the back barrier layer 120 may be a graded layer. In one aspect, the back barrier layer 120 may be a step-graded layer. In one aspect, the back barrier layer 120 may be multiple layers.

The step 506 of forming the back barrier layer 120 may include forming the back barrier layer 120 with a low Al concentration AlGaN buffer layer to provide a barrier to reduce electron injection into the buffer layer. In this regard, the barrier to reduce electron injection into the buffer layer results in a gate lag reduction structure, a gate lag elimination structure, and/or the like. For example, the back barrier layer 120 may be implemented with about 4% Al concentration AlGaN to provide a barrier to reduce electron injection into the buffer. In this regard, about may be within 0.5%, 1%, 1.5%, or 2%. In particular aspects, the back barrier layer 120 may be implemented with AlGaN with an Al concentration of 1% to 6%, 1% to 1.5%, 1.5% to 2%, 2% to 2.5%, 2.5% to 3%, 3% to 3.5%, 3.5% to 4%, 3.5% to 4.5%, 3.8% to 4.2%, 4% to 4.5%, 4.5% to 5%, 5% to 5.5%, or 5.5% to 6%, to provide a barrier to reduce electron injection into the buffer, a gate lag reduction structure, a gate lag elimination structure, and/or the like.

The process 500 may include a step 508 of forming the channel layer 104 on the back barrier layer 120. The channel layer 104 may be grown or deposited on the back barrier layer 120 as described in the disclosure. In one aspect, the channel layer 104 may be GaN.

Further during the process 500 as part of step 510, the barrier layer 108 may be formed on the channel layer 104. The barrier layer 108 may be formed as described in the disclosure. For example, the barrier layer 108 may be an n-type conductivity layer or may be undoped. In one aspect, the barrier layer 108 may be AlGaN.

Further during the process 500 as part of step 512, to create a place for the p-type material contact 118 with the p-type material layer 106, a recess 119 may be created by removing at least part of the barrier layer 108, at least part of the channel layer 104, at least part of the back barrier layer 120, and/or the like. The process 500 for forming the connection 154 may include removing any material above the p-type material layer 106, exposing the p-type material layer 106 on a side opposite of the substrate layer 102. In another aspect of the disclosure, to create a place for the p-type material contact 118 with the p-type material layer 106, the connection 138 may be created by removing at least part of the barrier layer 108, at least part of the channel layer 104, and/or the back barrier layer 120. The recess formation process may remove any material above the p-type material layer 106 within a portion of a region associated with the source 110, exposing the p-type material layer 106 on a side opposite of the substrate layer 102.

Further during the process 500 as part of step 514, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable. In some aspects, the source 110 may include Al, Ti, Si, Ni, and/or Pt. In one aspect, a region 164 under the source 110 that is a N+ material may be formed in the barrier layer 108. In one aspect, a region 164 under the drain 112 may be Si doped.

Further during the process 500 as part of step 514, the drain 112 may be arranged on the barrier layer 108. Like the source 110, the drain 112 may be an ohmic contact of Ni or another suitable material, and may also be annealed in a similar fashion. In one aspect, an n+ implant may be used in conjunction with the barrier layer 108 and the contacts are made to the implant. In one aspect, a region 164 under the drain 112 that is a N+ material may be formed in the barrier layer 108. In one aspect, a region 164 under the drain 112 may be Si doped.

Further during the process 500 as part of step 514, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials. In some aspects, the contacts of the gate 114 may include Al, Ti, Si, Ni, and/or Pt.

Further during the process 500 as part of step 514, the spacer layer 116 may be formed. The spacer layer 116 may be a passivation layer, such as SiN, AlO, SiO, $SiO_2$, AlN, or the like, or a combination incorporating multiple layers thereof, which may be deposited over the exposed surface of the barrier layer 108.

The source 110 and the drain 112 electrodes may be formed making ohmic contacts such that an electric current flows between the source 110 and drain 112 electrodes via a two-dimensional electron gas (2DEG) induced at the heterointerface 152 between the channel layer 104 and barrier layer 108 when a gate 114 electrode is biased at an appropriate level. In one aspect, the source 110 may be electrically coupled to the barrier layer 108, the drain 112 may be electrically coupled to the barrier layer 108, and the gate 114 may be electrically coupled to the barrier layer 108 such that an electric current flows between the source 110 and the drain 112 via a two-dimensional electron gas (2DEG) induced at the heterointerface 152 between the channel layer 104 and the barrier layer 108 when the gate 114 electrode is biased at an appropriate level. In one aspect, the source 110 may be electrically coupled to the transistor 100, the drain 112 may be electrically coupled to the transistor 100, and the gate 114 may be electrically coupled to the transistor 100 such that an electric current flows between the source 110 and the drain 112 via a two-dimensional electron gas (2DEG) induced at the heterointerface 152 between the channel layer 104 and the barrier layer 108 when a gate 114 is biased at an appropriate level. In various aspects, the gate 114 may control a flow of electrons in the 2DEG based on a signal and/or bias placed on the gate 114. In this regard, depending on a composition of the layers and/or a doping of the layers, the transistor 100 can be normally on or the transistor 100 can be normally off with no bias or signal on the gate. In one aspect, the heterointerface 152 may be in the range of 0.005 μm to 0.007 μm, 0.007 μm to 0.009 μm, and 0.009 μm to 0.011 μm.

The gate 114 may extend on top of a spacer or the spacer layer 116. The spacer layer 116 may be etched and the gate 114 deposited such that the bottom of the gate 114 is on the surface of barrier layer 108. The metal forming the gate 114 may be patterned to extend across spacer layer 116 so that the top of the gate 114 forms a field plate 132.

Further during some aspects of the process 500 as part of step 514, a second spacer layer 117 may be formed and a field plate 132 may be arranged on top of the second spacer layer 117 and may be separated from the gate 114. In one aspect, the field plate 132 may be deposited on the second spacer layer 117 between the gate 114 and the drain 112. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the connection 154 may be formed with the field plate 132 during the same manufacturing step (see FIG. 10). In one aspect, a plurality of the field plates 132 may be used. In one aspect, a plurality of the field plates 132 may be used and each of the plurality of field plates 132 may be stacked with a dielectric material therebetween. In one aspect, the field plate 132 extends toward the edge of gate 114 towards the drain 112. In one aspect, the field plate 132 extends towards the source 110. In one aspect, the field plate 132 extends towards the drain 112 and towards the source 110. In another aspect, the field plate 132 does not extend toward the edge of gate 114. Finally, the structure may be covered with a dielectric spacer layer such as silicon nitride. The dielectric spacer layer may also be implemented similar to the spacer layer 116. Moreover, it should be noted that the cross-sectional shape of the gate 114, shown in the Figures is exemplary. For example, the cross-sectional shape of the gate 114 in some aspects may not include the T-shaped extensions. Other constructions of the gate 114 may be utilized.

It should be noted that the steps of process 500 may be performed in a different order consistent with the aspects described above. Moreover, the process 500 may be modified to have more or fewer process steps consistent with the various aspects disclosed herein. In one aspect of the process 500, the transistor 100 may be implemented with only the p-type material layer 106.

In one aspect of the transistor 100 as described herein, the p-type material layer 106 may be doped as highly as possible with minimum achievable sheet resistance. In one aspect, the p-type material layer 106 may have an implantation concentration less than $10^{19}$. In one aspect, the p-type material layer 106 may have an implantation concentration less than $10^{20}$. In one aspect, the p-type material layer 106 may have an implantation concentration of $10^{17}$-$10^{20}$, $10^{19}$-$10^{20}$, $10^{18}$-$10^{19}$, or $10^{17}$-$10^{18}$. In one aspect, the p-type material layer 106 may have an implantation concentration $10^{19}$ or greater. In one aspect, the p-type material layer 106 may have an implantation concentration of $10^{18}$-$10^{20}$, $10^{18}$-$10^{19}$, or $10^{19}$-$10^{20}$.

In one aspect of the transistor 100 as described herein, the p-type material layer 106 doping may be less than 1E17 $cm^3$. In one aspect, the p-type material layer 106 doping may be less than 2E17 $cm^3$. In one aspect, the p-type material layer 106 doping may be less than 6E17 $cm^3$. In one aspect, the p-type material layer 106 doping may be less than 2E18 $cm^3$. In one aspect, the p-type material layer 106 doping may be in the range of 5E15 to 5E17 per $cm^3$. In these aspects, the p-type material layer 106 doping concentration may be greater than a doping concentration of the p-type material layer 106.

One aspect of the transistor 100 may be implemented as a Group III-Nitride transistor with at least one back barrier structure and at least one buried p-type layer. One aspect includes a method associated with the transistor 100 that may be implemented as a Group III-Nitride transistor with at least one back barrier structure and at least one buried p-type layer. One aspect includes a method of implementing the transistor 100 as a Group III-Nitride transistor with at least one back barrier structure and at least one buried p-type layer. One aspect includes a method of making the transistor 100 as a Group III-Nitride transistor with at least one back barrier structure and at least one buried p-type layer.

Accordingly, the disclosure has presented a solution to addressing lag effect in Group-III nitride HEMTs and improving the performance of such devices. Additionally, the disclosure has presented a solution to addressing traps that cause memory effects that adversely affect performance. In particular, the disclosure has provided an implementation of a transistor 100 in conjunction with a p-type material layer 106 and a back barrier layer 120, associated structures thereof, and/or associated processes thereof, that may provide a systematic approach to reducing lag. More specifically, the transistor 100 of the disclosure may implement the p-type material layer 106 and/or processes thereof as a drain lag reduction structure and/or process to reduce the drain lag effect and the transistor 100 of the disclosure may implement the back barrier layer 120 and/or processes thereof as a gate lag reduction structure and/or process to reduce the gate lag effect.

In particular, the disclosure has provided an implementation of a transistor 100 in conjunction with a p-type material layer 106 and a back barrier layer 120, associated structures thereof, and/or associated processes thereof, that may provide a synergistic overall reduction of lag of the transistor 100 that was an unexpected result of the combined structures of the back barrier layer 120 and the p-type material layer 106.

According to aspects of this disclosure, one or more aspects of the transistor 100 as disclosed may be utilized to implement an amplifier, a radar amplifier, radar components, a microwave radar amplifier, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like. The L band is the Institute of Electrical and Electronics Engineers (IEEE) designation for the range of frequencies in the radio spectrum from 1 to 2 gigahertz (GHz). The S band is a designation by the IEEE for a part of the microwave band of the electromagnetic spectrum covering frequencies from 2 to 4 GHz. The X band is the designation for a band of frequencies in the microwave radio region of the electromagnetic spectrum indefinitely set at approximately 7.0-11.2 GHz. The C-band is the designation given to the radio frequencies from 500 to 1000 MHz. The Ku band is the portion of the electromagnetic spectrum in the microwave range of frequencies from 12 to 18 GHz.

According to aspects of this disclosure, one or more aspects of the transistor 100 as disclosed may be configured in a package and may be implemented as a RF package, a MMIC RF package, and/or the like and may house RF devices. In particular, the RF devices may implement one or more of resistors, inductors, capacitors, Metal-Oxide-Silicon (MOS) capacitors, impedance matching circuits, matching circuits, input matching circuits, output matching circuits, intermediate matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, integrated passive devices (IPD), matching networks, and the like to support various functional technology as input, output, and/or intrastage functions to the package, and/or the like. The package implemented as a MMIC package may further include the transistor 100. The package implemented as a MMIC package may include, connect, support, or the like a radar transmitter, radar transmitter functions, a microwave radar transmitter, microwave radar transmitter functions, a radar receiver, radar receiver functions, a microwave radar receiver, microwave radar receiver functions, and/or the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;
a gate on the group III-Nitride barrier layer;
a drain electrically coupled to the group III-Nitride barrier layer; and
a p-region being arranged at or below the group III-Nitride barrier layer,
wherein at least a portion of the p-region is arranged vertically below at least one of the following: the source, the gate, and area between the gate and the drain; and
wherein the group III-Nitride back barrier layer is configured with low background impurity levels;
wherein the low background impurity levels are defined as impurities less than 1E15 per cubic cm;
wherein a part of a source side of the substrate is free of the p-region; and
wherein a part of a drain side of the substrate is free of the p-region.

2. The apparatus of claim 1, wherein the group III-Nitride back barrier layer comprises the low background impurity levels configured at least in part as a gate lag reduction structure.

3. The apparatus of claim 1, wherein the p-region is configured at least in part as a drain lag reduction structure; and wherein the group III-Nitride back barrier layer is on a nucleation layer.

4. The apparatus of claim 1, wherein the group III-Nitride back barrier layer comprises the low background impurity levels configured at least in part as a gate lag reduction structure, the p-region is configured at least in part as a drain lag reduction structure, and the group III-Nitride back barrier layer and the p-region reduce overall lag.

5. The apparatus of claim 1,
wherein the group III-Nitride back barrier layer is configured with low background impurity levels of the at least one of the following: silicon, oxygen, and carbon.

6. The apparatus of claim 1, wherein the group Nitride back barrier layer is configured as a sharp interface to the group III-Nitride channel layer and the sharp interface being configured to function as a barrier for electrons.

7. The apparatus of claim 1,
wherein the group III-Nitride back barrier layer is arranged directly on a nucleation layer or directly on the substrate.

8. The apparatus of claim 1, wherein the group III-Nitride back barrier layer comprises AlGaN with an Al concentration of 1% to 4.5%.

9. The apparatus of claim 1,
wherein the group III-Nitride back barrier layer is structured by epitaxial growth with low background impurity levels of at least one of the following: silicon (Si), oxygen (O), and carbon (C).

10. The apparatus of claim 1, comprising:
a nucleation layer formed on the substrate,
wherein the group III-Nitride back barrier layer is arranged directly on the nucleation layer.

11. The apparatus of claim 1, wherein the p-region is structured and arranged such that no portion of the p-region is located vertically below the drain.

12. The apparatus of claim 1, further comprising a field plate, wherein the field plate is electrically coupled to said source.

13. The apparatus of claim 1 wherein the p-region is arranged under and across a length of the gate and extends toward the source and the drain.

14. The apparatus of claim 1 wherein the p-region vertically overlaps the source.

15. The apparatus of claim 1 wherein the p-region extends toward the drain, but does not vertically overlap the drain.

16. The apparatus of claim 1 wherein the p-region comprises no direct electrical connections.

17. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;
a gate on the group III-Nitride barrier layer;
a drain electrically coupled to the group III-Nitride barrier layer; and
a p-region being arranged at or below the group III-Nitride barrier layer,
wherein at least a portion of the p-region is arranged vertically below at least one of the following: the source, the gate, and area between the gate and the drain; and
wherein the group III-Nitride back barrier layer is configured with low background impurity levels;
wherein the low background impurity levels are defined as impurities less than 1E15 per cubic cm;
wherein a portion of the substrate includes the p-region located vertically below the source; and
wherein another portion of the substrate does not include the p-region located vertically below the source.

18. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;
a gate on the group III-Nitride barrier layer;
a drain electrically coupled to the group III-Nitride barrier layer; and
a p-region being arranged at or below the group III-Nitride barrier layer,
wherein at least a portion of the p-region is arranged vertically below at least one of the following: the source, the gate, and area between the gate and the drain; and
wherein the group III-Nitride back barrier layer is configured with low background impurity levels;
wherein the low background impurity levels are defined as impurities less than 1E15 per cubic cm;
wherein the substrate does not include the p-region located vertically below the source; and
wherein the substrate does not include the p-region located vertically below the drain.

19. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;
a gate on the group III-Nitride barrier layer;
a drain electrically coupled to the group III-Nitride barrier layer; and
a p-region being arranged at or below the group III-Nitride barrier layer,
a field plate,
wherein the p-region is implanted;
wherein at least a portion of the p-region is arranged vertically below at least one of the following: the source, the gate, and area between the gate and the drain; and
wherein the group III-Nitride back barrier layer is configured with low background impurity levels; and
wherein the low background impurity levels are defined as impurities less than 1E15 per cubic cm.

20. The apparatus of claim 19, wherein:
a part of a source side of the substrate is free of the p-region; and
a part of a drain side of the substrate is free of the p-region.

21. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;
a gate on the group III-Nitride barrier layer;
a drain electrically coupled to the group III-Nitride barrier layer; and
a p-region being arranged at or below the group III-Nitride barrier layer; and
a field plate, wherein the field plate is electrically coupled to said source,
wherein at least a portion of the p-region is arranged vertically below at least one of the following: the source, the gate, and area between the gate and the drain;
wherein the group III-Nitride back barrier layer is configured with low background impurity levels;
wherein the low background impurity levels are defined as impurities less than 1E15 per cubic cm; and
wherein the p-region is structured and arranged to extend a limited length parallel to the group III-Nitride barrier layer such that the p-region is not located vertically below areas past the source and the drain.

22. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;

a gate on the group III-Nitride barrier layer;
a drain electrically coupled to the group III-Nitride barrier layer; and
a p-region being arranged at or below the group III-Nitride barrier layer; and
a field plate, wherein the field plate is electrically coupled to said source,
wherein at least a portion of the p-region is arranged vertically below at least one of the following: the source, the gate, and area between the gate and the drain;
wherein the group III-Nitride back barrier layer is configured with low background impurity levels;
wherein the low background impurity levels are defined as impurities less than 1E15 per cubic cm; and
wherein the p-region extends toward the source, but does not vertically overlap the source.

23. An apparatus, comprising:
a substrate;
a group III-Nitride back barrier layer on the substrate;
a group III-Nitride channel layer on the group III-Nitride back barrier layer;
a group III-Nitride barrier layer on the group III-Nitride channel layer, the group III-Nitride barrier layer comprising a higher bandgap than a bandgap of the group III-Nitride channel layer;
a source electrically coupled to the group III-Nitride barrier layer;
a gate on the group III-Nitride barrier layer;
a drain electrically coupled to the group III-Nitride barrier layer; and
a p-region being arranged at or below the group III-Nitride barrier layer; and
a field plate, wherein the field plate is electrically coupled to said source,
wherein at least a portion of the p-region is arranged vertically below at least one of the following: the source, the gate, and area between the gate and the drain;
wherein the group III-Nitride back barrier layer is configured with low background impurity levels;
wherein the low background impurity levels are defined as impurities less than 1E15 per cubic cm; and
wherein the p-region vertically overlaps the drain.

24. A method of making a device comprising:
providing a substrate;
providing a group III-Nitride back barrier layer on the substrate;
providing a group III-Nitride channel layer on the group III-Nitride back barrier layer;
providing a group III-Nitride barrier layer on the group III-Nitride channel layer, the group III-Nitride barrier layer comprising a higher bandgap than a bandgap of the group III-Nitride channel layer;
electrically coupling a source to the group III-Nitride barrier layer;
arranging a gate on the group III-Nitride barrier layer;
electrically coupling a drain to the group III-Nitride barrier layer; and
providing a p-region being arranged at or below the group III-Nitride barrier layer,
wherein at least a portion of the p-region is arranged vertically below at least one of the following: the source, the gate, and area between the gate and the drain;
wherein the group III-Nitride back barrier layer is configured with low background impurity levels;
wherein the low background impurity levels are defined as impurities less than 1E15 per cubic cm;
wherein the group III-Nitride back barrier layer is on a nucleation layer;
wherein the p-region is configured at least in part as a drain lag reduction structure; and
wherein the substrate does not include the p-region located vertically below the source.

25. The method of making the device of claim 24,
wherein the group III-Nitride back barrier layer comprises the low background impurity levels configured at least in part as a gate lag reduction structure; and
wherein the group III-Nitride back barrier layer comprises AlGaN with an Al concentration of 1% to 4.5%.

26. The method of making the device of claim 24, wherein the group III-Nitride back barrier layer comprises the low background impurity levels configured at least in part as a gate lag reduction structure, the p-region is configured at least in part as a drain lag reduction structure, and the group III-Nitride back barrier layer and the p-region reduce overall lag.

27. The method of making the device of claim 24,
wherein the group III-Nitride back barrier layer comprises the low background impurity levels configured with low background impurity levels of the following: silicon, oxygen, and carbon.

28. The method of making the device of claim 24, wherein the group III-Nitride back barrier layer is arranged directly on a nucleation layer or directly on the substrate.

29. The method of making the device of claim 24, wherein the group III-Nitride back barrier layer is configured as a sharp interface to the group III-Nitride channel layer.

30. The method of making the device of claim 24, wherein the group III-Nitride back barrier layer comprises AlGaN.

31. The method of making the device of claim 24, wherein the group III-Nitride back barrier layer comprises AlGaN with an Al concentration of 1% to 6%.

32. The method of making the device of claim 24, wherein the group III-Nitride back barrier layer is structured by epitaxial growth with low background impurity levels of at least one of the following: silicon (Si), oxygen (O), and carbon (C).

33. The method of making the device of claim 24, further comprising a nucleation layer formed on the substrate,
wherein the group III-Nitride back barrier layer is arranged on the nucleation layer.

34. The method of making the device of claim 24, wherein:
a part of a source side of the substrate is free of the p-region; and
a part of a drain side of the substrate is free of the p-region.

35. The method of making the device of claim 24, wherein:
a portion of the substrate includes the p-region located vertically below the source; and
another portion of the substrate does not include the p-region located vertically below the source.

36. The method of making the device of claim 24, wherein:
the substrate does not include the p-region located vertically below the source; and
the substrate does not include the p-region located vertically below the drain.

37. The method of making the device of claim 24, further comprising forming the p-region such that no portion of the p-region is located vertically below the drain.

38. The method of making the device of claim 24, further comprising implanting the p-region.

39. The method of making the device of claim 24, further comprising providing a field plate.

40. The method of making the device of claim 24, further comprising providing a field plate, wherein the field plate is electrically coupled to said source.

41. The method of making the device of claim 40, wherein the p-region is structured and arranged to extend a limited length parallel to the group III-Nitride barrier layer such that the p-region is not located vertically below areas past the source and the drain.

42. The method of making the device of claim 24 wherein the p-region is arranged under and across a length of the gate and extends toward the source and the drain.

43. The method of making the device of claim 24 wherein the p-region extends toward the source, but does not vertically overlap the source.

44. The method of making the device of claim 24 wherein the p-region vertically overlaps the source.

45. The method of making the device of claim 24 wherein the p-region extends toward the drain, but does not vertically overlap the drain.

46. The method of making the device of claim 24 wherein the p-region vertically overlaps the drain.

47. The method of making the device of claim 24 wherein the p-region comprises no direct electrical connections.

48. The method of making the device of claim 24 wherein the p-region is electrically connected to the source.

* * * * *